United States Patent
Lane et al.

(10) Patent No.: US 11,605,594 B2
(45) Date of Patent: Mar. 14, 2023

(54) PACKAGE COMPRISING A SUBSTRATE AND A HIGH-DENSITY INTERCONNECT INTEGRATED DEVICE COUPLED TO THE SUBSTRATE

(71) Applicant: QUALCOMM Incorporated, San Diego, CA (US)

(72) Inventors: Ryan Lane, San Diego, CA (US); Li-Sheng Weng, San Diego, CA (US); Charles David Paynter, Encinitas, CA (US); Eric David Foronda, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 17/017,361

(22) Filed: Sep. 10, 2020

(65) Prior Publication Data
US 2021/0296246 A1  Sep. 23, 2021

Related U.S. Application Data

(60) Provisional application No. 62/993,544, filed on Mar. 23, 2020.

(51) Int. Cl.
*H01L 23/538* (2006.01)
*H01L 25/00* (2006.01)
*H01L 25/065* (2023.01)

(52) U.S. Cl.
CPC ...... *H01L 23/5385* (2013.01); *H01L 25/0655* (2013.01); *H01L 25/50* (2013.01)

(58) Field of Classification Search
CPC . H01L 23/5385; H01L 25/0655; H01L 25/50; H01L 24/13; H01L 23/5381; H01L 23/49816; H01L 24/16; H01L 24/32; H01L 2224/16227; H01L 2225/06517; H01L 2225/0652; H01L 2924/15192; H01L 25/0652

See application file for complete search history.

(56) References Cited

U.S. PATENT DOCUMENTS 9,431,371 B2   8/2016  Karikalan et al.
9,799,616 B2  10/2017  Hu
10,490,520 B2 11/2019  Wang et al.
(Continued)

FOREIGN PATENT DOCUMENTS

WO   2019132967 A1   7/2019

OTHER PUBLICATIONS

International Search Report and Written Opinion—PCT/US2021/023035—ISA/EPO—dated Jul. 9, 2021.

*Primary Examiner* — Thanh Y. Tran
(74) *Attorney, Agent, or Firm* — Loza & Loza, LLP

(57) ABSTRACT

A package comprising a substrate, an integrated device, and an interconnect integrated device. The substrate includes a first surface and a second surface. The substrate further includes a plurality of interconnects. The integrated device is coupled to the substrate. The interconnect integrated device is coupled to a surface of the substrate. The integrated device, the interconnect integrated device and the substrate are configured to provide an electrical path for an electrical signal of the integrated device, that travels through at least the substrate, then through the interconnect integrated device and back through the substrate.

26 Claims, 20 Drawing Sheets

PROFILE VIEW

(56) References Cited

U.S. PATENT DOCUMENTS

| | | |
|---|---|---|
| 10,510,721 B2 | 12/2019 | Bhagavat et al. |
| 10,580,738 B2 | 3/2020 | Sikka et al. |
| 2007/0081312 A1 | 4/2007 | Noda et al. |
| 2017/0110407 A1 | 4/2017 | Chaware et al. |
| 2019/0043792 A1 | 2/2019 | Weerasekera et al. |
| 2019/0057915 A1 | 2/2019 | Starkston et al. |
| 2021/0028116 A1* | 1/2021 | Ganesan ........... H01L 23/49822 |
| 2021/0272931 A1* | 9/2021 | Patil ................. H01L 23/49816 |

* cited by examiner

PROFILE VIEW

PROFILE VIEW

PLAN VIEW

PLAN VIEW

PLAN VIEW

PROFILE VIEW

PACKAGE COMPRISING A SUBSTRATE AND A HIGH-DENSITY INTERCONNECT INTEGRATED DEVICE COUPLED TO THE SUBSTRATE

CROSS-REFERENCE/CLAIM OF PRIORITY TO RELATED APPLICATION

The present application claims priority to and the benefit of U.S. Provisional Application No. 62/993,544, filed on Mar. 23, 2020, and titled, "PACKAGE COMPRISING A SUBSTRATE AND A HIGH-DENSITY INTERCONNECT INTEGRATED DEVICE COUPLED TO THE SUBSTRATE", which is hereby expressly incorporated by reference.

FIELD

Various features relate to packages that include an integrated device, but more specifically to a package that includes an integrated device and a substrate.

BACKGROUND

FIG. 1 illustrates a package 100 that includes a substrate 102, an integrated device 104, an integrated device 106, and an encapsulation layer 108. The substrate 102 includes at least one dielectric layer 120, a plurality of interconnects 122, and a plurality of solder interconnects 124. A plurality of solder interconnects 144 is coupled to the substrate 102 and the integrated device 104. A plurality of solder interconnects 164 is coupled to the substrate 102 and the integrated device 106. The encapsulation layer 108 encapsulates the integrated device 104 and the integrated device 106. Fabricating a small package that includes a substrate with high density interconnects can be challenging. There is an ongoing need to provide more compact packages that can accommodate high density interconnects and/or high pin counts.

SUMMARY

Various features relate to packages that include an integrated device, but more specifically to a package that includes an integrated device and a substrate.

One example provides a package comprising a substrate, an integrated device, and an interconnect integrated device. The substrate includes a first surface and a second surface. The substrate further includes a plurality of interconnects. The integrated device is coupled to the substrate. The interconnect integrated device is coupled to a surface of the substrate. The integrated device, the interconnect integrated device and the substrate are configured to provide an electrical path for an electrical signal of the integrated device, that extends through at least the substrate, then through the interconnect integrated device and back through the substrate.

Another example provides an apparatus that includes a substrate, an integrated device, and means for integrated device interconnection. The substrate includes a first surface and a second surface. The substrate further includes a plurality of interconnects. The integrated device is coupled to the substrate. The means for integrated device interconnection is coupled to a surface of the substrate. The integrated device, the means for integrated device interconnection and the substrate are configured to provide an electrical path for an electrical signal of the integrated device, that extends through at least the substrate, then through the means for integrated device interconnection and back through the substrate.

Another example provides a method for fabricating a package. The method provides a substrate comprising a first surface and a second surface, where the substrate further comprises a plurality of interconnects. The method couples an integrated device to the substrate. The method couples an interconnect integrated device to a surface of the substrate. The integrated device, the interconnect integrated device, and the substrate are configured to provide an electrical path for an electrical signal of the integrated device, that extends through at least the substrate, then through the interconnect integrated device and back through the substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, an electronic circuit (which may be formed in an integrated device), and an interconnect integrated device. The substrate includes a first surface and a second surface. The substrate further includes a plurality of interconnects for providing electrical paths to a board. The integrated device is coupled to the first surface (or a second surface) of the substrate. The interconnect integrated device is coupled to the first surface (or a second surface) of the substrate. The integrated device, the interconnect integrated device, and the substrate are configured to provide an electrical path for an electrical signal of the integrated device, that extends through at least the substrate, then through the interconnect integrated device and back through the substrate. The integrated device, the interconnect integrated device and the substrate are coupled together in such a way that the electrical path for the electrical signal of the integrated device is configured to extend (e.g., travel) through the substrate, then through the interconnect integrated device and back through the substrate. The interconnect integrated device may provide at least one electrical path (e.g., electrical connection) between two integrated devices coupled to the substrate. The interconnect integrated device may be a substrate that includes at least one dielectric layer and a plurality of interconnects. The interconnect integrated device may be a high-density interconnect integrated device that is configured to have interconnects with a lower minimum pitch than the minimum pitch of interconnects from the substrate. The interconnect integrated device may enable a package to have small and compact form factor, while also providing a high input/output (I/O) pin count. The interconnect integrated device may provide improve voltage drop for integrated device, higher capacitance density, shorter paths between integrated devices and/or lower inductance.

Figure 1:
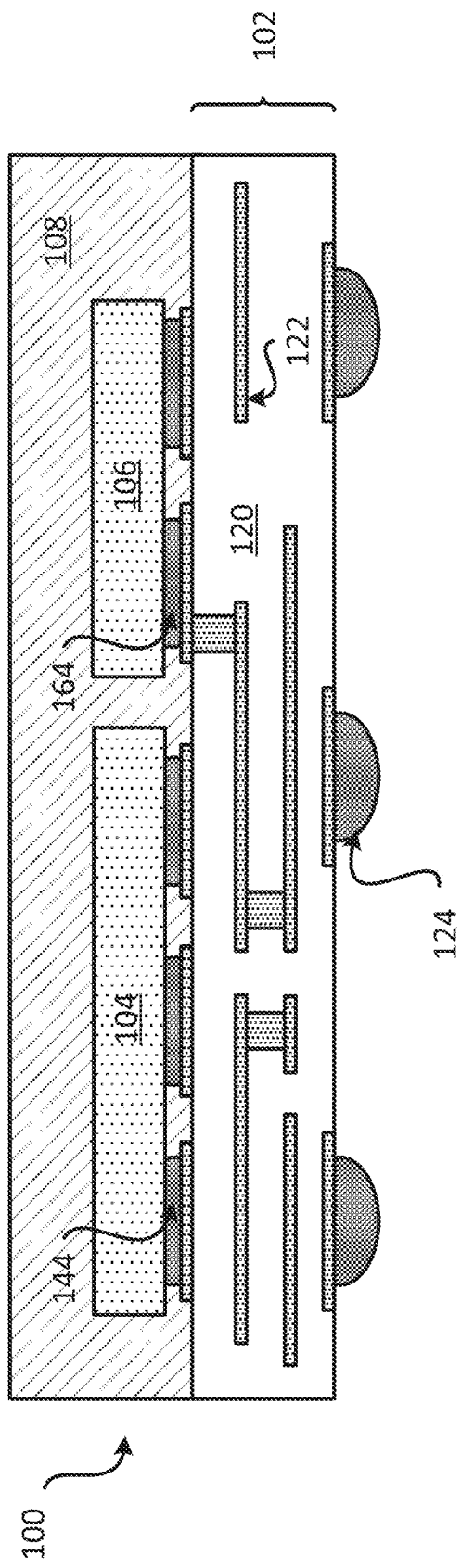
FIG. 1 illustrates a profile view of a package that includes an integrated device and a substrate.
Figure 2:
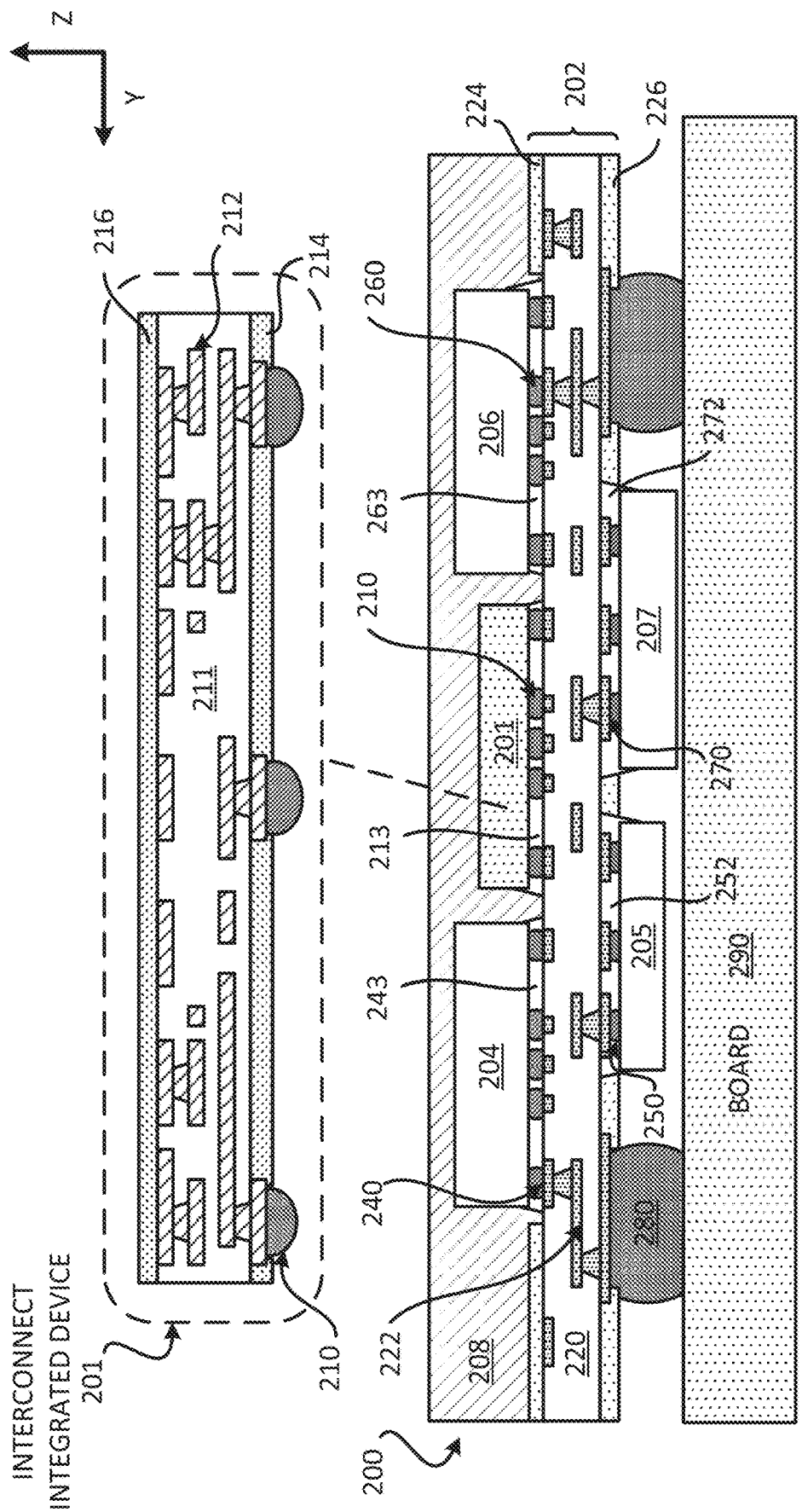
FIG. 2 illustrates a profile view of a package that includes a high-density interconnect integrated device coupled to a substrate.

Exemplary Package Comprising a High Density Interconnect Integrated Device Coupled to a Substrate FIG. 2 illustrates a profile view of a package 200 that includes a high-density interconnect integrated device. The package 200 is coupled to a board 290 (e.g., printed circuit board (PCB)) through a plurality of solder interconnects 280. The package 200 provides a package with a compact small factor while also having a high input/output pin count. The package 200 provided improved capacitance density, shorter paths between integrated devices, lower inductance, and/or less routing constraints.

As shown in FIG. 2, the package 200 includes a substrate 202, a first integrated device 204, a second integrated device 206, an encapsulation layer 208, an interconnect integrated device 201, an integrated device 205, and an integrated device 207. The interconnect integrated device 201 may be configured as a bridge between two or more integrated devices. As will be further described below, an integrated device (e.g., 204, 206), an interconnect integrated device (e.g., 201), and the substrate 202 are coupled together in such a way that when an electrical signal (e.g., first electrical signal, second electrical signal) travels between the two integrated devices (e.g., 204, 206) and a board (e.g., 290), the electrical signal travels through at least the substrate 202, then through the interconnect integrated device (e.g., 201) and back through the substrate 202. This may be achieved by an interconnect integrated device (e.g., 201) providing at least one electrical path between a first electrical contact provided by the substrate 202 and a second electrical contact provided by the substrate 202, where the first contact is electrically connected to the integrated device (e.g., 204, 206) and where the second contact is electrically connected to one or more of the interconnects. In the above example, the interconnect integrated device 201 may be configured as a bridge such that when at least one electrical signal travels between two integrated devices (e.g., 204, 206) and/or a board (e.g., 290), the at least one electrical signal may travel through the interconnect integrated device 201. The at least one electrical signal may travel through at least one electrical path that is defined by interconnects of the package, the integrated device(s), the substrate and/or the interconnect integrated device(s).

The substrate 202 includes a first surface (e.g., top surface) and a second surface (e.g., bottom surface). The substrate 202 includes at least one dielectric layer 220, a plurality of interconnects 222, a first solder resist layer 224 and a second solder resist layer 226. The plurality of interconnects 222 may be configured to provide at least one electrical path to and/or from a board (e.g., 290). The plurality of interconnects 222 may provide at least one electrical path to at least one integrated device (e.g., 204, 205, 206, 207). The plurality of interconnects 222 may provide at least one electrical path (e.g., electrical connection) between two or more integrated devices (e.g., 204, 205, 206, 207). The plurality of interconnects 222 may have a first minimum pitch and a first minimum line and spacing (L/S). In some implementations, the first minimum pitch for the plurality of interconnects 222 is in a range of approximately 100-200 micrometers (μm). In some implementations, the first minimum line and spacing (L/S) for the plurality of interconnects 222 is in a range of approximately 9/9-12/12 micrometers (μm) (e.g., minimum line width of approximately 9-12 micrometers (μm), minimum spacing of approximately 9-12 micrometers (μm)). Different implementations may use different substrates. The substrate 202 may be a laminate substrate, a coreless substrate, an organic substrate, a substrate that includes a core layer. In some implementations, the at least one dielectric layer 220 may include a core layer and/or prepreg layers. The at least one dielectric layer 220 may have a dielectric constant in a range of approximately 3.5-3.7. The at least one dielectric layer 220 may include glass fabrics for reinforcing the substrate 202. An example of fabricating a substrate is further described below in FIGS. 10A-10C. As will be further described below, in some implementations, the substrate 202 may be fabricated using a modified semi-additive process (mSAP) or a semi-additive process (SAP).

The first integrated device 204 is coupled to the first surface (e.g., top surface) of the substrate 202. The first integrated device 204 is coupled to the substrate through a plurality of interconnects 240. The plurality of interconnects 240 may include copper pillars and/or solder interconnects. An underfill 243 is located between the substrate 202 and the first integrated device 204. The underfill 243 may surround the plurality of interconnects 240. The second integrated device 206 is coupled to the first surface (e.g., top surface) of the substrate 202. The second integrated device 206 is coupled to the substrate through a plurality of interconnects 260. The plurality of interconnects 260 may include copper pillars and/or solder interconnects. An underfill 263 is located between the substrate 202 and the second integrated device 206. The underfill 263 may surround the plurality of interconnects 240.

The integrated device 205 is coupled to the second surface (e.g., bottom surface) of the substrate 202. The integrated device 205 is coupled to the substrate through a plurality of interconnects 250. The plurality of interconnects 250 may include copper pillars and/or solder interconnects. An underfill 253 is located between the substrate 202 and the integrated device 205. The underfill 252 may surround the plurality of interconnects 250. The integrated device 207 is coupled to the second surface (e.g., bottom surface) of the substrate 202. The integrated device 207 is coupled to the substrate through a plurality of interconnects 270. The plurality of interconnects 270 may include copper pillars and/or solder interconnects. An underfill 272 is located between the substrate 202 and the integrated device 207. The underfill 272 may surround the plurality of interconnects 270. The integrated device 205 and the integrated device 207 may be located laterally to the plurality of solder interconnects 280.

The interconnect integrated device 201 is coupled to the first surface of the substrate 202. As will be further described below, the interconnect integrated device 201 may be a high-density interconnect integrated device. The interconnect integrated device 201 may be coupled to the substrate 202 through a plurality of solder interconnects 210 and/or pillar interconnects (e.g., copper pillar interconnects). The interconnect integrated device 201 is located between the first integrated device 204 and the second integrated device 206. This configuration helps improve the performance of the package, by reducing routing congestion in the substrate 202, and/or by reducing the paths for currents (e.g., signals) between the integrated devices. The end result, is a package with a more compact form factor. In addition, the interconnect integrated device 201 may help lower the cost of the substrate 202 because the interconnects of the substrate 202 do not need to be as close together (e.g., lower L/S) to achieve near die break-out, since the interconnects of the interconnect integrated device 201 will help with the near die break-out. As will be further described below, at least one interconnect integrated device may be located over another surface of the substrate 202. In some implementations, the interconnect integrated device may be integrated or embedded inside the substrate 202. An interconnect integrated device may be configured to provide at least one electrical path for at least one electrical signal. As will be further described below, an interconnect integrated device (e.g., 201, 701) may be configured as a bridge. An interconnect integrated device (e.g., 201, 701) may include a die (e.g., passive device die). An interconnect integrated device that is configured as a bridge and/or a passive device die may be free of active devices, such as transistors. Thus, an interconnect integrated device that is configured as a bridge and/or a passive device die may be free of a transistor.

The encapsulation layer 208 is located over the first surface (e.g., top surface) of the substrate 202 such that the encapsulation layer 208 encapsulates the first integrated device 204, the second integrated device 206, and the interconnect integrated device 201. The encapsulation layer 208 may include a mold, a resin, an epoxy and/or polymer. The encapsulation layer 208 may be a means for encapsulation.

The integrated device (e.g., 204, 205, 206, 207) may include a die (e.g., semiconductor bare die). The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 204, 205, 206, 207) may include at least one electronic circuit (e.g., first electronic circuit, second electronic circuit, etc. . . . ).

Different implementations may couple different components to the substrate 202. Other components (e.g., surface mounted components) that may be coupled to the substrate 202 include a passive device (e.g., capacitor).

Figure 7:
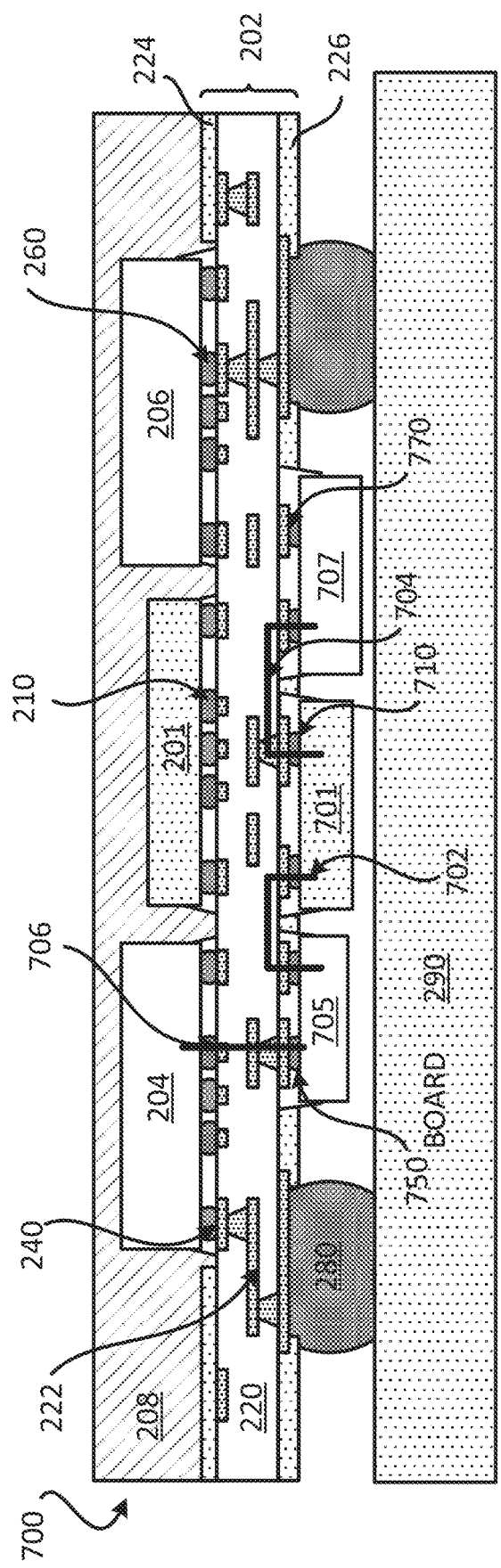
FIG. 7 illustrates a profile view of a package that includes a high-density interconnect integrated device coupled to a substrate.

The interconnect integrated device 201 may be a high-density interconnect integrated device that have a second minimum pitch and a second minimum line and spacing (L/S). In some implementations, the second minimum pitch for interconnects of the interconnect integrated device (e.g., 201) is in a range of approximately 100-200 micrometers (μm). In some implementations, the second minimum line and spacing (L/S) for interconnects of the interconnect integrated device (e.g., 201, 701) is in a range of approximately 2/2-5/5 micrometers (μm) (e.g., minimum line width of approximately 2-5 micrometers (μm), minimum spacing of approximately 2-5 micrometers (μm)). For example, as shown in FIG. 7, the interconnect integrated device 201 and the interconnect integrated device 701 may each have interconnects with a respective second minimum pitch that is less than the first minimum pitch of the substrate 202. Similarly, the interconnect integrated device 201 and the interconnect integrated device 701 may each have interconnects with a respective minimum pitch that is less than the first minimum line and spacing (L/S) of the substrate 202. A pitch may be defined as a center to center distance between two adjacent interconnects. The interconnect integrated device (e.g., 201, 701) is a localized integrated device configured to be placed in a region near an integrated device. The size of the interconnect integrated device may vary with different implementations. However, the footprint of the interconnect integrated device will be smaller than the footprint of the substrate 202.

As will be further described below, some electrical signals (e.g., first electrical signal, second electrical signals) to and from integrated devices (e.g., 204, 206) may be configured to travel through the interconnect integrated device 201. The interconnect integrated devices, which have higher density interconnects, allow the package 200 to provide higher I/O pin counts, without having to increase the size of the package 200. For example, using the interconnect integrated device 201 may allow the substrate 202 to have a lower number of metal layers, which may help reduce the overall height of the package 200. The one or more interconnect integrated devices 201 may help reduce congestion and/or entanglement in certain regions (e.g., regions near an integrated device) of the substrate 202 due to the high number of pin count and/or number of netlists. The interconnect integrated device 201 may have a lower height than the first integrated devices 204 and/or the second integrated device 206.

FIG. 2 illustrates that the interconnect integrated device 201 includes at least one dielectric layer 211, a plurality of interconnects 212, a passivation layer 214 and a substrate 216. The substrate 216 may include silicon (Si), glass, or quartz. The substrate 216 may be a die substrate. The interconnect integrated device 201 may include a front side and a back side. The back side of the interconnect integrated device 201 may be the side that includes the substrate 216. The front side of the interconnect integrated device 201 may be the side that includes the passivation layer 214 and/or the side to which the solder interconnect is coupled to the interconnect integrated device 201. The front side of the interconnect integrated device may be opposite to the back side of the interconnect integrated device. As will be further described below, the interconnect integrated device 201 (and/or any of the interconnect integrated device described in the disclosure) may be configured as a bridge. The interconnect integrated device 201 may include a die (e.g., passive device die). An interconnect integrated device that is configured as a bridge and/or a passive device die may be free of active devices, such as transistors. Thus, an interconnect integrated device that is configured as a bridge and/or a passive device die may be free of a transistor. As mentioned above, the interconnects of the interconnect integrated device may have higher density (e.g., lower minimum pitch and/or lower minimum L/S) than the interconnects of the substrate 202. The passivation layer 214 is located over a first surface of the interconnect integrated device 201. The plurality of solder interconnects 210 is coupled to the first surface of the interconnect integrated device 201.

As mentioned above, an interconnect integrated device may be a component that is coupled to the substrate 202, so that the package 200 may provide higher I/O pin counts without having to increase the overall size of the package 200 and/or may provide shorter paths between integrated devices. In some implementations, one or more electrical signals to and from one or more integrated devices may travel through one or more interconnect integrated devices. The one or more interconnect integrated devices (e.g., 201) may help reduce congestion and/or entanglement in certain areas of the substrate due to the high number of pin count and/or number of netlists. A netlist is an arrangement of components of a circuit and how the components are electrically coupled together. The one or more interconnect integrated device 201 has improved capacitance density, provides shorter paths between integrated devices, helps lower inductance, and/or reduces routing constraints.

In some implementations, the at least one dielectric layer 211 may include prepreg layers and/or photo-imageable dielectric layers. The at least one dielectric layer 211 may have a dielectric constant in a range of approximately 3.3-4.0. In some implementations, the at least one dielectric layer 211 of the interconnect integrated device may include glass fabrics. However, the glass fabrics will be finer than the glass fabrics in the at least one dielectric layer 220 of the substrate 202.

Figure 3:
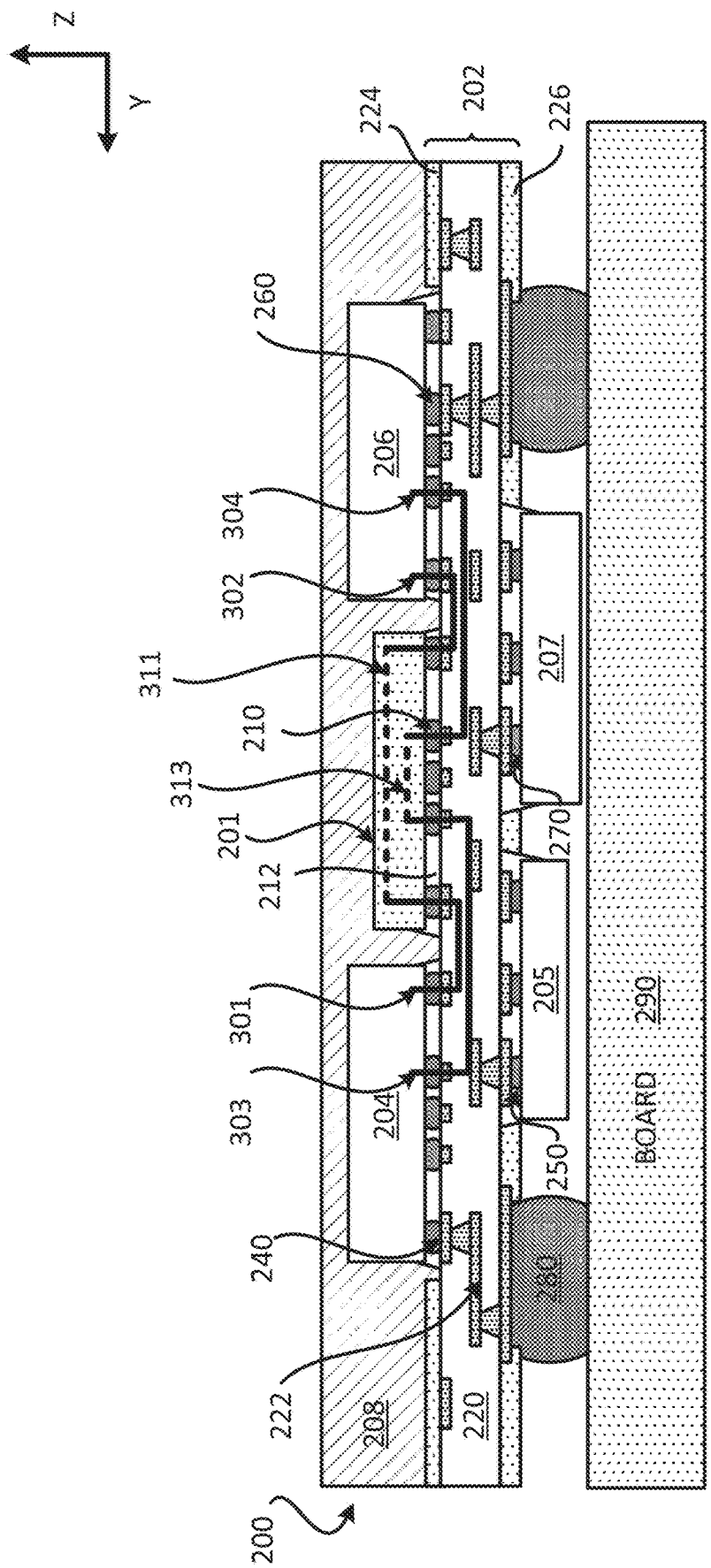
FIG. 3 illustrates a view of possible electrical paths in a package that includes a high-density interconnect integrated device coupled to a substrate.

FIG. 3 illustrates a view of how electrical signals may conceptually be configured to travel in a package. FIG. 3 illustrates (i) a first electrical path 301 for a first electrical signal, (ii) a second electrical path 302 for a second electrical signal, (iii) a third electrical path 303 for a third electrical signal, and (iv) a fourth electrical path 304 for a fourth electrical signal. The first electrical path 301 may be configured to allow a signal to travel between the first integrated device 204 and the interconnect integrated device 201. The second electrical path 302 may be configured to allow a signal to travel between the second integrated device 206 and the interconnect integrated device 201. The third electrical path 303 may be configured to allow a signal to travel between the first integrated device 204 and the interconnect integrated device 201. The fourth electrical path 304 may be configured to allow a signal to travel between the second integrated device 206 and the interconnect integrated device 201. An electrical path 311 may be coupled to the electrical path 301 and the electrical path 302. An electrical path 313 may be coupled to the electrical path 303 and the electrical path 304. The electrical path 311 may include interconnects from the interconnect integrated device 201. The electrical path 313 may include interconnects from the interconnect integrated device 201.

In some implementations, the first integrated device 204 and the second integrated device 206 may be configured to be electrically coupled to each other through the substrate 202 and the interconnect integrated device 201. For example, at least one electrical current (e.g., electrical signal) between the first integrated device 204 and the second integrated device 206 may travel through the substrate 202, the interconnect integrated device 201, and back through the substrate.

In one example, the first electrical path 301 and the second electrical path 302 may be configured to be coupled (e.g., electrically coupled) together so that the first integrated device 204 and the second integrated device 206 are configured to be electrically coupled together through the interconnect integrated device 201. Thus, as an example, the first integrated device 204 and the second integrated device 206 are configured to be electrically coupled together such that at least one electrical current (e.g., electrical signal) between the first integrated device 204 and the second integrated device 206 travel through (i) first interconnect(s) from the plurality of interconnects 240, (ii) first interconnect(s) from the plurality of interconnects 222 of the substrate 202, (iii) first solder interconnect(s) from the plurality of solder interconnects 210, (iv) first interconnect(s) (e.g., 212) from the interconnect integrated device 201, (v) second solder interconnect(s) from the plurality of solder interconnects 210, (vi) second interconnects(s) from the plurality of interconnects 222 of the substrate 202, and (vii) first solder interconnect from the plurality of interconnects 260.

The first electrical path 301 may include (i) first interconnect(s) from the plurality of interconnects 240, (ii) first interconnect(s) from the plurality of interconnects 222 of the substrate 202, (iii) first solder interconnect(s) from the plurality of solder interconnects 210, and/or (iv) first interconnect(s) (e.g., 212) from the interconnect integrated device 201.

The second electrical path 302 may include (i) first interconnect(s) from the plurality of interconnects 260, (ii) second interconnect(s) from the plurality of interconnects 222 of the substrate 202, (iii) second solder interconnect(s) from the plurality of solder interconnects 210, and/or (iv) first interconnect(s) (e.g., 212) from the interconnect integrated device 201.

The third electrical path 303 may include (i) first interconnect(s) from the plurality of interconnects 240, (ii) first interconnect(s) from the plurality of interconnects 222 of the substrate 202, (iii) first solder interconnect(s) from the plurality of solder interconnects 210, and/or (iv) first interconnect(s) (e.g., 212) from the interconnect integrated device 201.

The fourth electrical path 304 may include (i) first interconnect(s) from the plurality of interconnects 260, (ii) second interconnect(s) from the plurality of interconnects 222 of the substrate 202, (iii) second solder interconnect(s) from the plurality of solder interconnects 210, and/or (iv) first interconnect(s) (e.g., 212) from the interconnect integrated device 201.

It is noted that the two or more of the various electrical paths described in the disclosure may be configured to be electrically coupled to each other. For example, the electrical path 303 may be configured to be electrically coupled to the electrical path 304 (e.g., through electrical path 313). In another example, the electrical path 301 may be configured to be electrically coupled to the electrical path 302 (e.g., through electrical path 311). It is noted that the electrical path(s) for one or more signals may enter and exit through the front side of the interconnect integrated device (e.g., 201). That means that at least one electrical signal traveling through the interconnect integrated device may (i) enter through a front side of the interconnect integrated device, (ii) travel through interconnect(s) in the interconnect integrated device, and (iii) exit through the front side of the interconnect integrated device. For example, at least one electrical signal may enter through the electrical path 301, travel through the interconnect integrated device 201 and exit through the electrical path 302, or vice versa. Different implementations may have a different number of electrical signals that travel to and from different integrated devices. The path of these electrical signals may vary. An electrical signal may include I/O signals. Instead of I/O signals, the exemplary paths shown in the disclosure may be applicable to power and/or ground as well.

Figure 4:
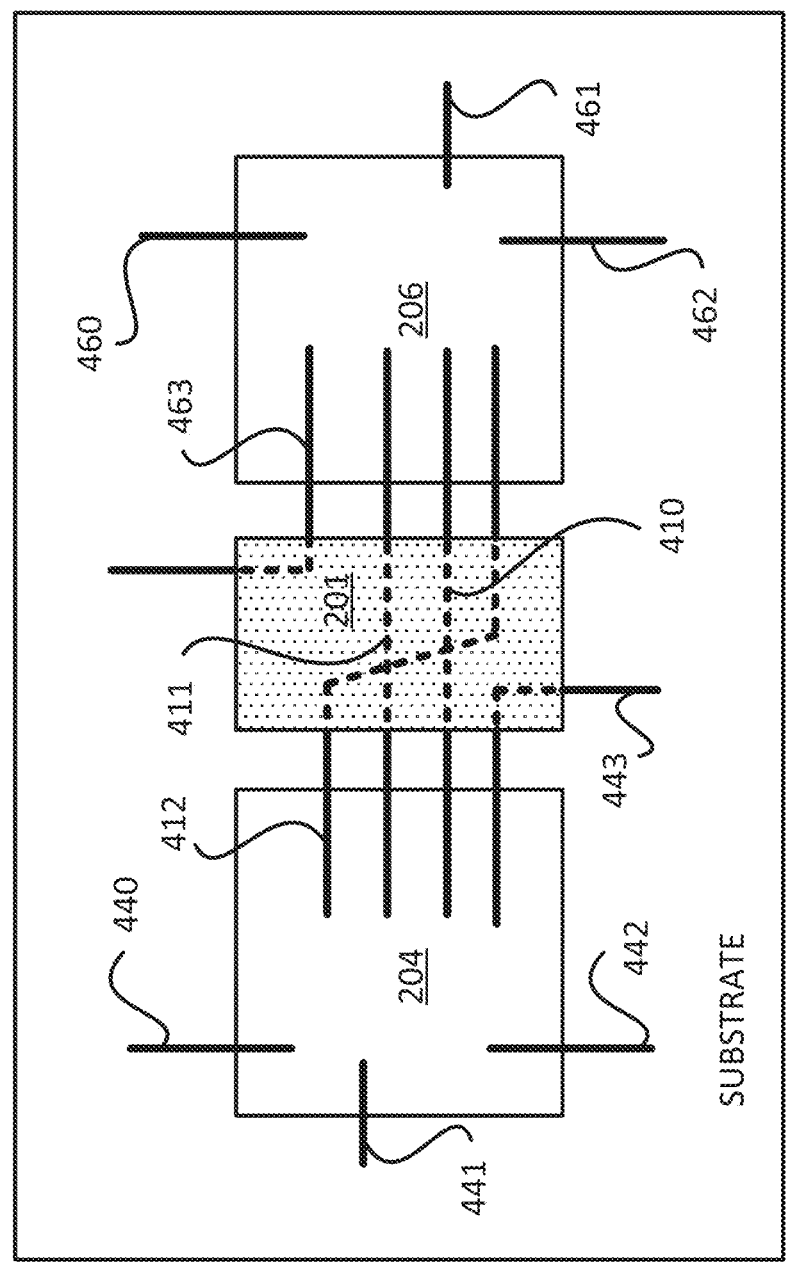
FIG. 4 illustrates a view of possible electrical paths in a package that includes a high-density interconnect integrated device coupled to a substrate.

FIG. 4 illustrates another view of how electrical signals may conceptually travel through a package. FIG. 4 illustrates a substrate 402, a first integrated device 204 coupled to the substrate 402, a second integrated device 206 coupled to the substrate 402, and an interconnect integrated device 201 coupled to the substrate 402. The substrate 402 may be similar to substrate 202, and thus may include similar components as the substrate 202. The substrate 402 may be implemented in any of the packages described in the disclosure.

FIG. 4 illustrates the interconnect integrated device 201 located between the first integrated device 204 and the second integrated device 206. The first integrated device 204, the second integrated device 206 and the interconnect integrated device 201 are located on a surface (e.g., first surface, second surface) of the substrate 402.

The first integrated device 204 includes electrical paths 410, 411, 412, 440, 441, 442 and 443 for electrical currents (e.g., electrical signals) for the first integrated device 204. The electrical paths 410, 411, 412, 440, 441, 442 and 443 may be conceptual representations of exemplary paths for electrical currents to and from the first integrated device 204. An electrical path may include interconnects and/or solder interconnects. The electrical paths 410, 411, 412, 443 and/or 463 may illustrate path(s) where at least one electrical signal may enter and exit through a front side of the interconnect integrated device 201.

The second integrated device 206 includes electrical paths 410, 411, 412, 460, 461, 462 and 463 for electrical currents (e.g., electrical signals) for the second integrated device 206. The electrical paths 410, 411, 412, 460, 461, 462 and 463 may be conceptual representations of exemplary paths for electrical currents to and from the second integrated device 206. An electrical path may include interconnects and/or solder interconnects.

As shown in FIG. 4, the first integrated device 204 and the second integrated device 206 may be configured to be electrically coupled together through the electrical paths 410, 411 and 412. The electrical paths 410, 411 and 412 are electrical paths where currents (e.g., signals) travel through the interconnect integrated device 201. The electrical paths 410, 411 and 412 may include interconnects in the substrate 402 and interconnects in the interconnect integrated device 201. The electrical paths 410, 411 and/or 412 may be similar to the combination of the electrical paths (e.g., (301, 302, 311), (303, 304, 313)) of FIG. 3. Each electrical path (440, 441, 442, 460, 461, and 463) may include their own respective interconnects from the plurality of interconnects 222 of the substrate 402.

FIG. 4 illustrates that an electrical path for an integrated device may include the interconnect integrated device 201, even if the electrical path does not provide an electrical path between two integrated devices. For example, a signal that travel through the electrical path 443 may mean that the signal to and from the first integrated device 204 may travel through the interconnect integrated device 203, even if the signal does not end up with the second integrated device 206. Similarly, a signal that travel through the electrical path 463 may mean that the signal to and from the second integrated device 206 may travel through the interconnect integrated device 203, even if the signal does not end up with the first integrated device 204.

Different implementations may have different numbers of electrical paths and/or electrical paths that take up different routing.

Figure 5:
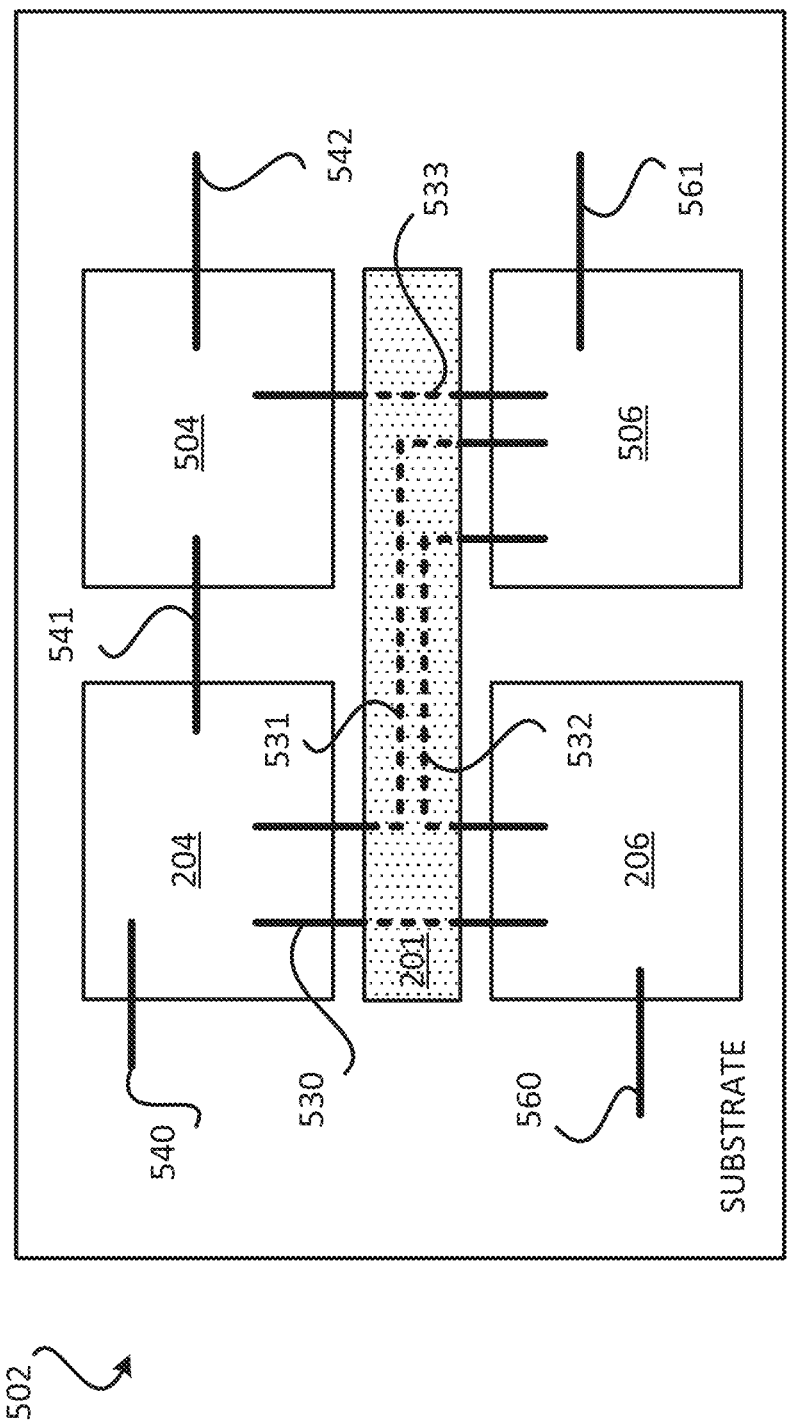
FIG. 5 illustrates a view of possible electrical paths in a package that includes a high-density interconnect integrated device coupled to a substrate.

FIG. 5 illustrates another view of how electrical signals may conceptually travel through a package. FIG. 5 illustrates a substrate 502, a first integrated device 204 coupled to the substrate 502, a second integrated device 206 coupled to the substrate 502, an interconnect integrated device 201 coupled to the substrate 502, an integrated device 504 coupled to the substrate 502, and an integrated device 506 coupled to the substrate 502. The substrate 502 may be similar to substrate 202, and thus may include similar components as the substrate 202. The substrate 502 may be implemented in any of the packages described in the disclosure.

FIG. 5 illustrates the first integrated device 204 includes the electrical paths 530, 531, 540 and 541. The second integrated device 206 includes the electrical paths 530, 532 and 560. The integrated device 504 includes the electrical paths 533, 541, and 542. The integrated device 506 includes the electrical paths 531, 532, 533 and 561. Each electrical path (540, 541, 542, 560, and 561) may include their own respective interconnects from the plurality of interconnects 222 of the substrate 502. The electrical paths 530, 531, 532, and/or 533 may illustrate path(s) where at least one electrical signal may enter and exit through a front side of the interconnect integrated device 201.

The first integrated device 204 is coupled to the integrated device 504 through the electrical path 541. The first integrated device 204 is coupled to the second integrated device 206 through the electrical path 530. The electrical path 530 includes interconnects from the interconnect integrated device 201. Thus, the first integrated device 204 may be coupled to the second integrated device 206 through the substrate 502 and the interconnect integrated device 201. The first integrated device 204 is coupled to the integrated device 506 through the electrical path 531. The electrical path 531 includes interconnects from the interconnect integrated device 201. Thus, the first integrated device 204 may be coupled to the integrated device 506 through the substrate 502 and the interconnect integrated device 201.

The second integrated device 206 is coupled to the integrated device 506 through the electrical path 532. The electrical path 532 includes interconnects from the interconnect integrated device 201. Thus, the second integrated device 206 may be coupled to the integrated device 506 through the substrate 502 and the interconnect integrated device 201.

The integrated device 504 is coupled to the integrated device 506 through the electrical path 533. The electrical path 533 includes interconnects from the interconnect integrated device 201. Thus, the integrated device 504 may be coupled to the integrated device 506 through the substrate 502 and the interconnect integrated device 201.

Figure 6:
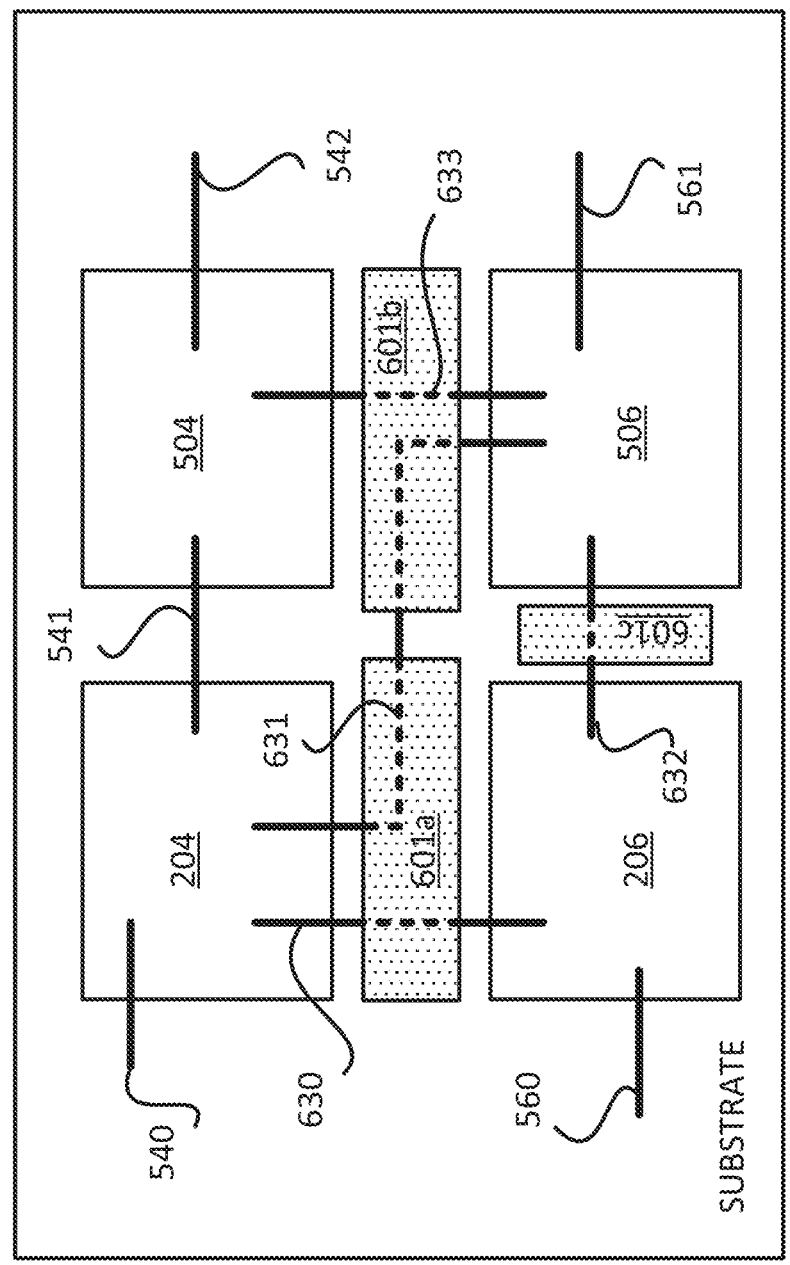
FIG. 6 illustrates a view of possible electrical paths of a package on package (PoP) that includes a high-density interconnect integrated device coupled to a substrate.

FIG. 6 illustrates another view of how electrical signals may conceptually travel through a package. FIG. 6 illustrates a substrate 602, a first integrated device 204 coupled to the substrate 602, a second integrated device 206 coupled to the substrate 602, an interconnect integrated device 601a coupled to the substrate 602, an interconnect integrated device 601b coupled to the substrate 602, an interconnect integrated device 601c coupled to the substrate 602, an integrated device 504 coupled to the substrate 602, and an integrated device 506 coupled to the substrate 602. The substrate 602 may be similar to substrate 202, and thus may include similar components as the substrate 202. The interconnect integrated devices (e.g., 601a, 601b, 601c) may be similar to the interconnect integrated device 201, and thus may include similar components as the interconnect integrated device 201. The substrate 602 and the interconnect integrated devices (e.g., 601a, 601b, 601c) may be implemented in any of the packages described in the disclosure.

FIG. 6 illustrates that the first integrated device 204 is coupled to the second integrated device 206 through an electrical path 630. The electrical path 630 includes interconnect in the substrate 602 and interconnects in the interconnect integrated device 601a. Thus, the first integrated device 204 may be coupled to the second integrated device 206 through the substrate 602 and the interconnect integrated device 601a.

The first integrated device 204 is coupled to the integrated device 506 through an electrical path 631. The electrical path 631 includes interconnects in the substrate 602, interconnects in the interconnect integrated device 601a, and interconnects in the interconnect integrated device 601b. Thus, the first integrated device 204 may be coupled to the integrated device 506 through the substrate 602, the interconnect integrated device 601a and the interconnect integrated device 601b.

The second integrated device 206 is coupled to the integrated device 506 through an electrical path 632. The electrical path 632 includes interconnects in the substrate 602 and interconnects in the interconnect integrated device 601c. Thus, the second integrated device 206 may be coupled to the integrated device 506 through the substrate 602 and the interconnect integrated device 601c.

The integrated device 504 is coupled to the integrated device 506 through an electrical path 633. The electrical path 633 includes interconnects in the substrate 602 and interconnects in the interconnect integrated device 601b. Thus, the integrated device 504 may be coupled to the integrated device 506 through the substrate 602 and the interconnect integrated device 601b.

The electrical paths 630, 631, 632, and/or 633 may illustrate path(s) where at least one electrical signal may enter and exit through a front side of the interconnect integrated device (e.g., 601a, 601b, 601c). The paths taken by the various electrical signals may be similar to the electrical paths described in FIG. 3. However, it is noted that the paths of the electrical signals shown in the disclosure are exemplary and/or conceptual. Different implementations may use different paths for the electrical signals. Moreover, electrical signals and/or electrical paths may travel through different types of interconnects (e.g., vias, traces, pads, pillars), solder interconnects and/or components (e.g., passive devices). Thus, for example, in some implementations, an electrical signal traveling between an integrated device and an interconnect integrated device may travel through at least one intervening component (e.g., passive device, capacitor) between the integrated device and the interconnect integrated device. The paths shown for the electrical signals may also be applied to power and/or ground.

As mentioned above, a package may include different components and/or different numbers of components that are located over different portions of the substrate. FIG. 7 illustrates a package 700 that includes an interconnect integrated device. The package 700 is similar to the package 200 of FIG. 2 and includes similar components to the package 200. The package 700 includes the first integrated device 204, the second integrated device 206, an integrated device 705, an integrated device 707, the interconnect integrated device 201, and an interconnect integrated device 701.

As shown in FIG. 7, the integrated device 705, the integrated device 707, and the interconnect integrated device 701 are coupled to the second surface (e.g., bottom surface) of the substrate 202. The integrated device 705, the integrated device 707, the interconnect integrated device 701 may be located laterally to the plurality of solder interconnects 280.

The second interconnect integrated device 701 is similar to the interconnect integrated device 201. The second interconnect integrated device 701 may include the same components and/or materials as the interconnect integrated device 201. The second interconnect integrated device 701 may include a different number of metal layers than the interconnect integrated device 201. An interconnect integrated device may be used to provide at least one electrical path between two or more integrated devices. For example, an electrical signal between a first integrated device and a second integrated device may travel through a substrate (e.g., through first plurality of interconnects of substrate), through an interconnect integrated device (e.g., through plurality of interconnects of interconnect integrated device) and back through the substrate (e.g., through second plurality of interconnects of substrate). The first integrated device and the second integrated device may be located over the same surface of the substrate or over different surfaces of the substrate. The terms "first surface" and "second surface" of a substrate are arbitrary, and may mean any surface of the substrate. For example, the first surface of the substrate may be a bottom surface of the substrate, and the second surface of the substrate may be a top surface of the substrate. In another example, the first surface of the substrate may be a top surface of the substrate, and the second surface of the substrate may be a bottom surface of the substrate. An interconnect integrated device (e.g., 201, 701) may be means for integrated device interconnection. An example of a method for fabricating an interconnect integrated device is illustrated and described below in FIGS. 8A-8D.

The interconnect integrated device 701 may be coupled to the plurality of interconnects 222 through the plurality of interconnects 710. The plurality of interconnects 710 may include copper pillars and/or solder interconnects. The integrated device 705 may be coupled to the plurality of interconnects 222 through the plurality of interconnects 750. The plurality of interconnects 750 may include copper pillars and/or solder interconnects. The integrated device 707 may be coupled to the plurality of interconnects 222 through the plurality of interconnects 770. The plurality of interconnects 770 may include copper pillars and/or solder interconnects. The interconnect integrated device 701 is located between the integrated device 705 and the integrated device 707. The integrated device 705 and the integrated device 707 may be configured to be electrically coupled to each other through the interconnect integrated device 701.

The integrated device 705 may be coupled to the interconnect integrated device 701 through the electrical path 702. The integrated device 707 may be coupled to the interconnect integrated device 701 through the electrical path 704. The integrated device 705 may be coupled to the integrated device 707 through the electrical path 702 and the electrical path 704.

The electrical path 702 may include (i) first interconnect(s) from the plurality of interconnects 750, (ii) first interconnect(s) from the plurality of interconnects 222 of the substrate 202, (iii) first solder interconnect(s) from the plurality of interconnects 710, and/or (iv) first interconnect(s) (e.g., 212) from the interconnect integrated device 701.

The electrical path 704 may include (i) first interconnect(s) from the plurality of interconnects 770, (ii) second interconnect(s) from the plurality of interconnects 222 of the substrate 202, (iii) second solder interconnect(s) from the plurality of interconnects 710, and/or (iv) first interconnect(s) (e.g., 212) from the interconnect integrated device 701.

The first integrated device 204 may be coupled to the integrated device 705 through the electrical path 706. The electrical path 706 may include (i) first interconnect(s) from the plurality of interconnects 750, (ii) first interconnect(s) from the plurality of interconnects 222 of the substrate 202, and/or (iii) first solder interconnect(s) from the plurality of interconnects 250. It is noted that the two or more of the various electrical paths described in the disclosure may be configured to be electrically coupled to each other. For example, the electrical path 702 may be configured to be electrically coupled to the electrical path 704. In another example, the electrical path 702 may be configured to be electrically coupled to the electrical path 706. It is noted that the electrical path(s) for one or more signals may enter and exit through the front side of the interconnect integrated device (e.g., 201, 601a, 601b, 601c, 701). That means that an electrical signal traveling through an interconnect integrated device may (i) enter through a front side of the interconnect integrated device, (ii) travel through interconnect(s) in the interconnect integrated device, and (iii) exit through the front side of the interconnect integrated device. For example, at least one electrical signal may enter through the electrical path 702, travel through the interconnect integrated device 701 and exit through the electrical path 704, or vice versa.

It is noted that the configurations and electrical paths described in FIGS. 4-6 may be applicable to the configuration of FIG. 7. It is noted that any of the packages described in the disclosure may be part of a package on package (PoP). Moreover, the packages (e.g., 200, 700) described in the disclosure may be coupled to an interposer.

In some implementations, the interconnect integrated devices (e.g., 201, 701) may be configured to include a passive device (e.g., capacitor), or may be configured as a passive device. For example, the interconnect integrated devices may be configured as a decoupling integrated device. The at least one passive device of interconnect integrated device may be configured as an electrical decoupler for a power distribution network (PDN) for a package. When an interconnect integrated device includes at least one passive device, such as a capacitor, one of more of the electrical paths described in the disclosure may travel through the at least one passive device of an interconnect integrated device.

A passive device, such as capacitor, may be a metal insulator metal (MIM) capacitor that is formed based on interconnects on two metal layers of the interconnect integrated device. A high K dielectric layer may be located between interconnects on the two metal layers that define the MIM capacitor. For example, a MIM capacitor in the interconnect integrated device may be defined by interconnects on two metal layers from the plurality of interconnects 212. A high K dielectric layer (which may be different from the dielectric layer 211) may be located between interconnects on two metal layers that define the MIM capacitor. The capacitor may have be a high density capacitor that includes a capacitance density in a range of approximately 25 nanofarad per millimeter squared ($nF/mm^2$) to 1000 $nF/mm^2$, an equivalent series inductance (ESL) that is equal or less than 40 petahenry (pH) and frequency response that is equal or greater than 1 Gigahertz (GHz).

Exemplary Sequence for Fabricating a High-Density Interconnect Integrated Device FIGS. 8A-8D illustrate an exemplary sequence for providing or fabricating a high-density interconnect integrated device. In some implementations, the sequence of FIGS. 8A-8D may be used to provide or fabricate the interconnect integrated device 201 of FIG. 2, or any of the interconnect integrated device described in the disclosure.

It should be noted that the sequence of FIGS. 8A-8D may combine one or more stages in order to simplify and/or clarify the sequence for providing or fabricating the interconnect integrated device. In some implementations, the order of the processes may be changed or modified. In some implementations, one or more of processes may be replaced or substituted without departing from the scope of the disclosure. Different implementations may fabricate an interconnect integrated device differently.

Figure 8A:
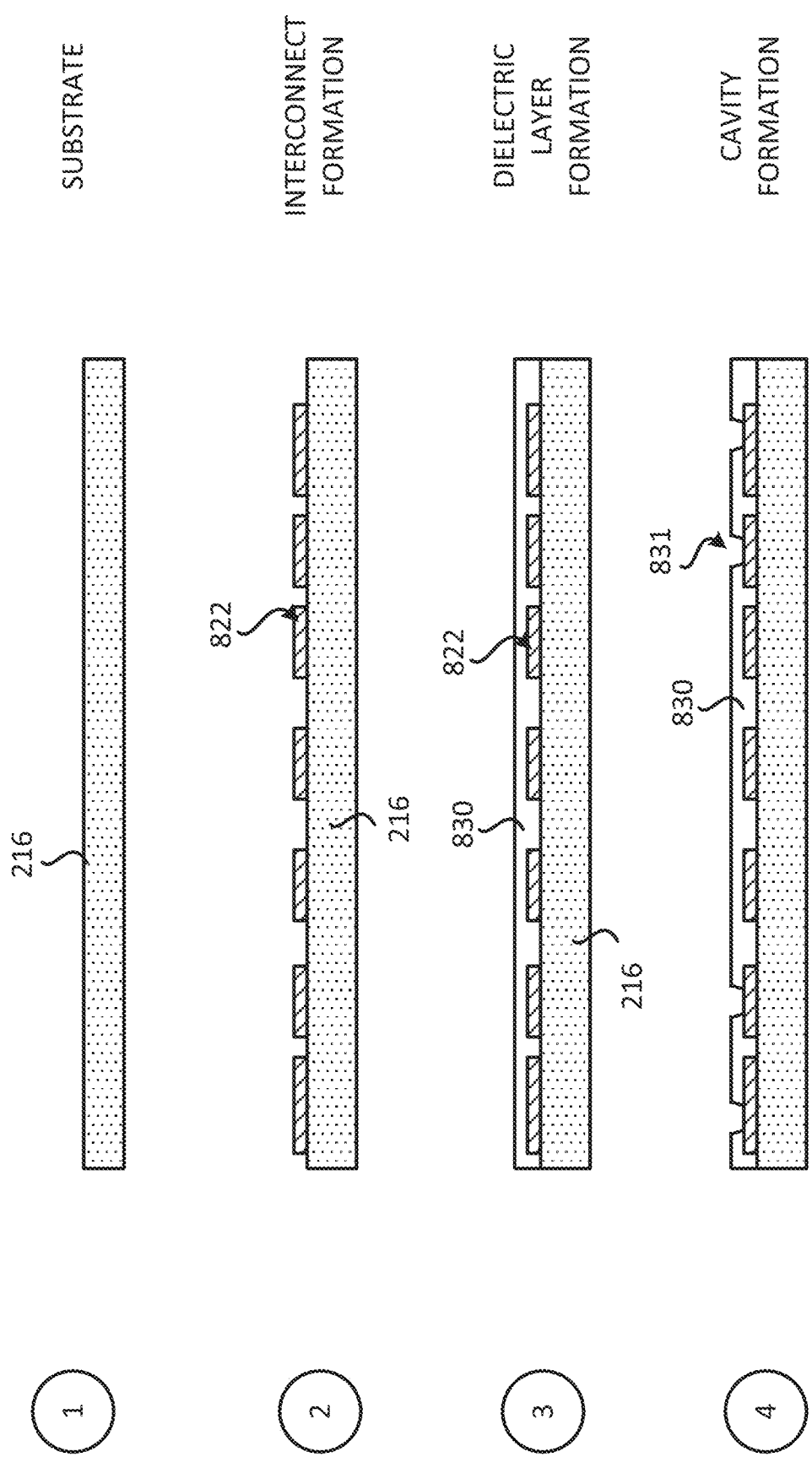
FIGS. 8A-8D illustrate an exemplary sequence for fabricating a high-density interconnect integrated device.

Stage 1, as shown in FIG. 8A, illustrates a state after a substrate 216 is provided. The substrate 216 may include glass and/or silicon.

Stage 2 illustrates a state after a plurality of interconnects 822 is formed over the substrate 216. The plurality of interconnects 822 may include traces and/or pads. Forming the plurality of interconnects 822 may include forming a seed layer, performing a lithography process, a plating process, a stripping process and/or an etching process. The plurality of interconnects 822 may be part of the plurality of interconnects 212.

Stage 3 illustrates a state after the dielectric layer 830 is formed over the plurality of interconnects 822 and the substrate 216. The dielectric layer 830 may be deposited and/or coated over the plurality of interconnects 822 and the dielectric layer 820. The dielectric layer 830 may include polymer. The dielectric layer 830 may be similar to the dielectric layer 211.

Stage 4 illustrates a state after cavities 831 are formed in the dielectric layer 830. An etching process may be used to form the cavities 831.

Figure 8B:
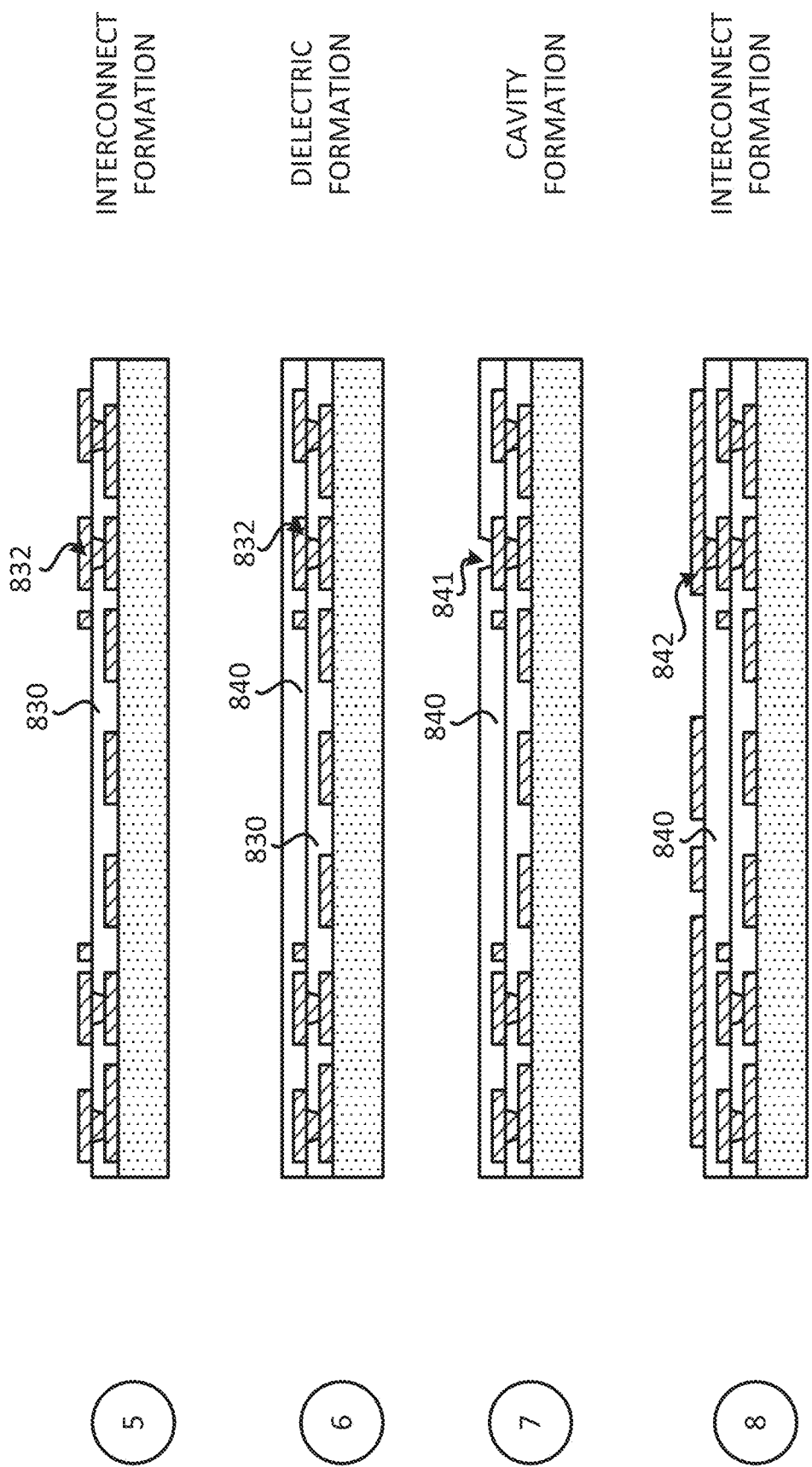

Stage 5, as shown in FIG. 8B, illustrates a state after a plurality of interconnects 832 is formed over the dielectric layer 830. The plurality of interconnects 832 may include vias, traces and/or pads. Forming the plurality of interconnects 832 may include performing a lithography process, a plating process, a stripping process and/or an etching process. The plurality of interconnects 832 may be part of the plurality of interconnects 212.

Stage 6 illustrates a state after the dielectric layer 840 is formed over the plurality of interconnects 832 and the dielectric layer 830. The dielectric layer 840 may be deposited and/or coated over the plurality of interconnects 832 and the dielectric layer 830. The dielectric layer 840 may include polymer. The dielectric layer 840 may be similar to the dielectric layer 830.

Stage 7 illustrates a state after cavities 841 are formed in the dielectric layer 840. An etching process may be used to form the cavities 841.

Stage 8 illustrates a state after a plurality of interconnects 842 is formed over the dielectric layer 840. The plurality of interconnects 842 may include vias, traces and/or pads. Forming the plurality of interconnects 842 may include performing a lithography process, a plating process, a stripping process and/or an etching process. The plurality of interconnects 842 may be part of the plurality of interconnects 212.

Figure 8C:
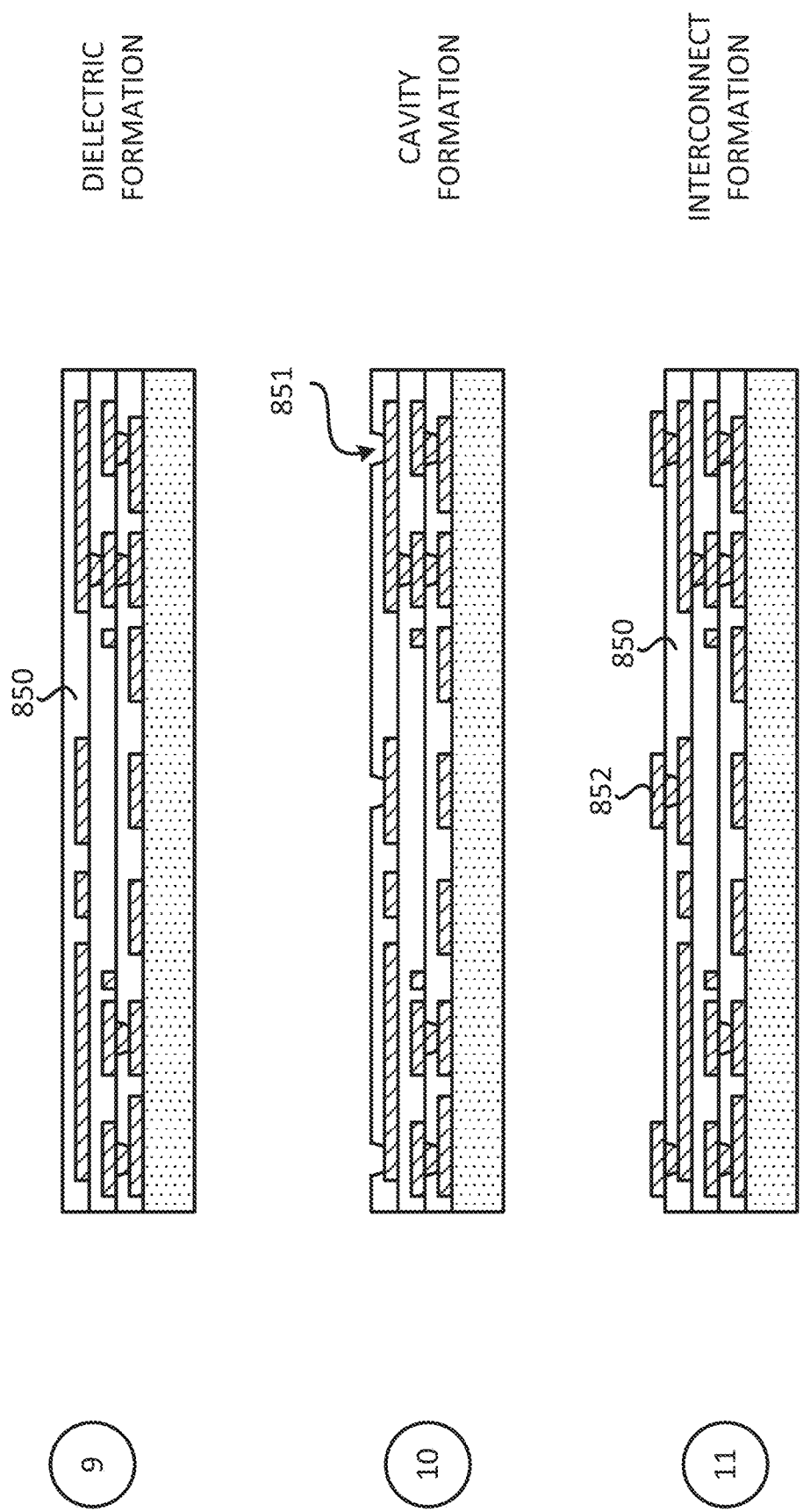

Stage 9, as shown in FIG. 8C, illustrates a state after the dielectric layer 850 is formed over the plurality of interconnects 842 and the dielectric layer 840. The dielectric layer 850 may be deposited and/or coated over the plurality of interconnects 842 and the dielectric layer 840. The dielectric layer 850 may include polymer. The dielectric layer 850 may be similar to the dielectric layer 840.

Stage 10 illustrates a state after cavities 851 are formed in the dielectric layer 850. An etching process may be used to form the cavities 851.

Stage 11 illustrates a state after a plurality of interconnects 852 is formed over the dielectric layer 850. The plurality of interconnects 852 may include vias, traces and/or pads. Forming the plurality of interconnects 852 may include performing a lithography process, a plating process, a stripping process and/or an etching process. The plurality of interconnects 852 may be part of the plurality of interconnects 212.

Figure 8D:
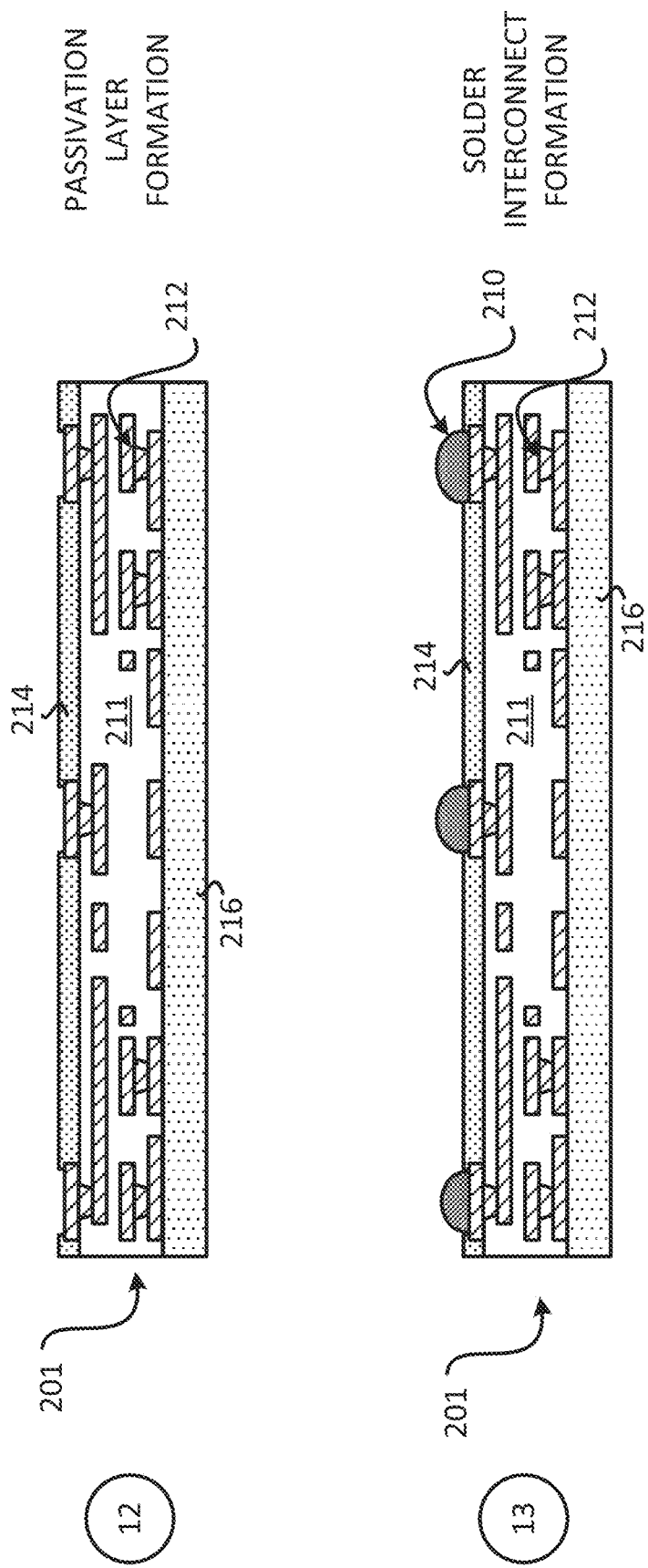

Stage 12, as shown in FIG. 8D, illustrates a state after the passivation layer 214 is formed over the at least one dielectric layer 211. The at least one dielectric layer 211 may represent the dielectric layers 830, 840 and 850. Stage 12 may illustrate the plurality of interconnects 212, which may include the plurality of interconnects 832, 842 and/or 852.

Stage 13 illustrates a state after the plurality of solder interconnects 210 is coupled to the interconnect integrated device 201. Stage 13 may illustrate an example of the interconnect integrated device 201 as described in FIG. 2. In some implementations, the interconnect integrated device 201 is part of a wafer, and singulation may be performed to cut the wafer into individual interconnect integrated devices. In some implementations, the sequence of FIGS. 8A-8D may be used to fabricate the interconnect integrated device 701.

As mentioned above, an interconnect integrated device may be configured to include at least one passive device or may configured as a passive device. The passive device, such as capacitor, may be a metal insulator metal (MIM) capacitor that is formed based on interconnects (e.g., 822, 832, 842) from any two metal layers of the interconnect integrated device. A high K dielectric layer (which may be different from the dielectric layer(s) 830, 840 and/or 850) may be formed between interconnects from two metal layers of the interconnect integrated device. The high K dielectric layer may be formed in a similar manner as any of the dielectric layers described above. Other dielectric layers (e.g., 830, 840, 850) may surround the high K dielectric layer. The at least one passive device of interconnect integrated device may be configured as an electrical decoupler for a power distribution network (PDN) for a package.

Figure 9:
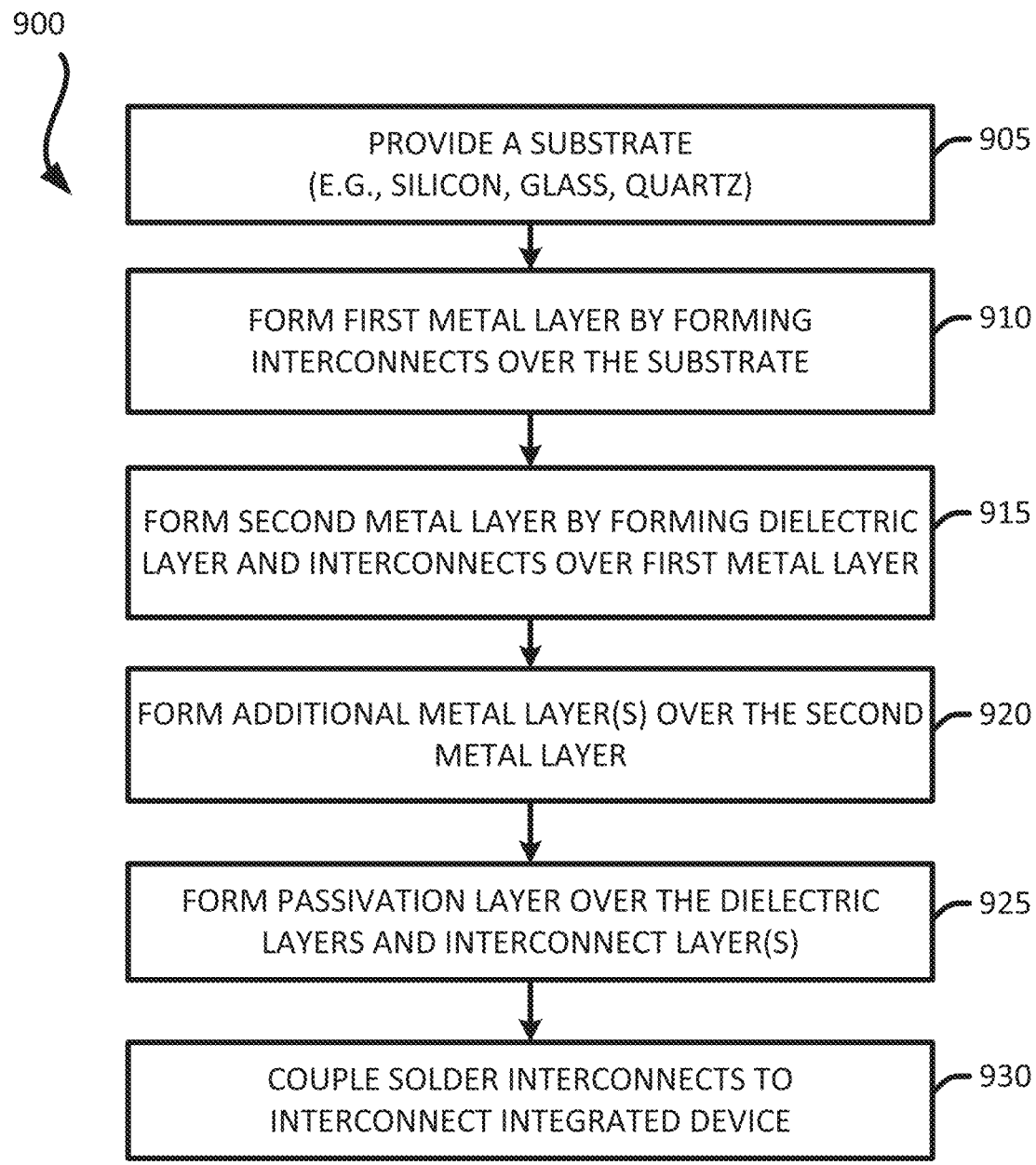
FIG. 9 illustrates an exemplary flow diagram of a method for fabricating a high-density interconnect integrated device.

Exemplary Flow Diagram of a Method for Fabricating a High-Density Interconnect Integrated Device In some implementations, fabricating a package that includes a high density interconnect integrated device includes several processes. FIG. 9 illustrates an exemplary flow diagram of a method 900 for providing or fabricating a high-density interconnect integrated device. In some implementations, the method 900 of FIG. 9 may be used to provide or fabricate the high-density interconnect integrated device (e.g., 201, 701) of FIGS. 2 and/or 7 described in the disclosure. However, the method 900 may be used to provide or fabricate any of the interconnect integrated devices described in the disclosure.

It should be noted that the method of FIG. 9 may combine one or more processes in order to simplify and/or clarify the method for providing or fabricating an interconnect integrated device. In some implementations, the order of the processes may be changed or modified. FIG. 9 will be described in terms of fabricating redistribution interconnects. However, the method of FIG. 9 may be used to fabricate any type of interconnect.

The method provides (at 905) a substrate (e.g., 216). The substrate 216 may include glass, quartz and/or silicon. Stage 1 of FIG. 8A illustrate an example of a substrate.

The method forms (at 910) a first metal layer by forming a plurality of interconnects 822 over the substrate (e.g., 216). Forming the plurality of interconnects may include performing a lithography process, performing a plating process, performing a stripping process and/or performing an etching process. Stage 2 of FIG. 8A, illustrate an example of forming a first metal layer for a high-density interconnect integrated device.

The method forms (at 915) a second metal layer by forming a dielectric layer (e.g., 830) and a plurality of interconnects 832 over the first metal layer. The dielectric layer may include a polymer. Forming the dielectric layer and the plurality of interconnects may include disposing a dielectric layer 830 over the dielectric layer 820 and the interconnects 822, performing a lithography process, performing a plating process, performing a stripping process and/or performing an etching process. Stages 3-5 of FIGS. 8A-8B, illustrate an example of forming a second metal layer (e.g., redistribution layer, redistribution metal layer) for a high-density interconnect integrated device. A redistribution layer (RDL) may be a form of a metallization layer. An RDL may include interconnects that include a U-shape or V-shape. The terms "U-shape" and" V-shape" shall be interchangeable. The terms "U-shape" and "V-shape" may refer to the side profile shape of the interconnects and/or redistribution interconnects. The U-shape interconnect and the V-shape interconnect may have a top portion and a bottom portion. A bottom portion of a U-shape interconnect (or a V-shape interconnect) may be coupled to a top portion of another U-shape interconnect (or a V-shape interconnect). Forming the metal layer and the dielectric layer may include using a back end of line (BEOL) process.

The method forms (at 920) additional metal layer(s) by forming one or more dielectric layers (e.g., 840, 850) and a plurality of interconnects (e.g., 842, 852) over the second metal layer. The dielectric layer may include a polymer. Forming the dielectric layer and the plurality of interconnects may include disposing one or more dielectric layers (e.g., 840, 850) over the dielectric layer 830 and the interconnects 832, performing a lithography process, performing a plating process, performing a stripping process and/or performing an etching process. Stages 7-11 of FIGS. 8B-8C, illustrate an example of forming additional metal layers for a high-density interconnect integrated device. Forming the additional metal layers and the additional dielectric layers may include using a back end of line (BEOL) process.

The method forms (at 925) a passivation layer (e.g., 214) over the dielectric layer of the interconnect integrated device (e.g., 201). The passivation layer (e.g., 214) may be disposed over the dielectric layer 211. Stage 12 of FIG. 8D, illustrates an example of a passivation layer formed over a dielectric layer of an interconnect integrated device.

The method couples (at 930) a plurality of solder interconnects (e.g., 210) is coupled to the interconnect integrated device (e.g., 201). Stage 13 of FIG. 8D may illustrate an example of solder interconnects coupled to an interconnect integrated device.

In some implementations, the interconnect integrated device 201 is part of a wafer, and singulation may be performed to cut the wafer into individual interconnect integrated devices. The method 900 may be used to fabricate an interconnect integrated device 201 that includes the plurality of interconnects 212.

Exemplary Sequence for Fabricating a Substrate

Figure 10A:
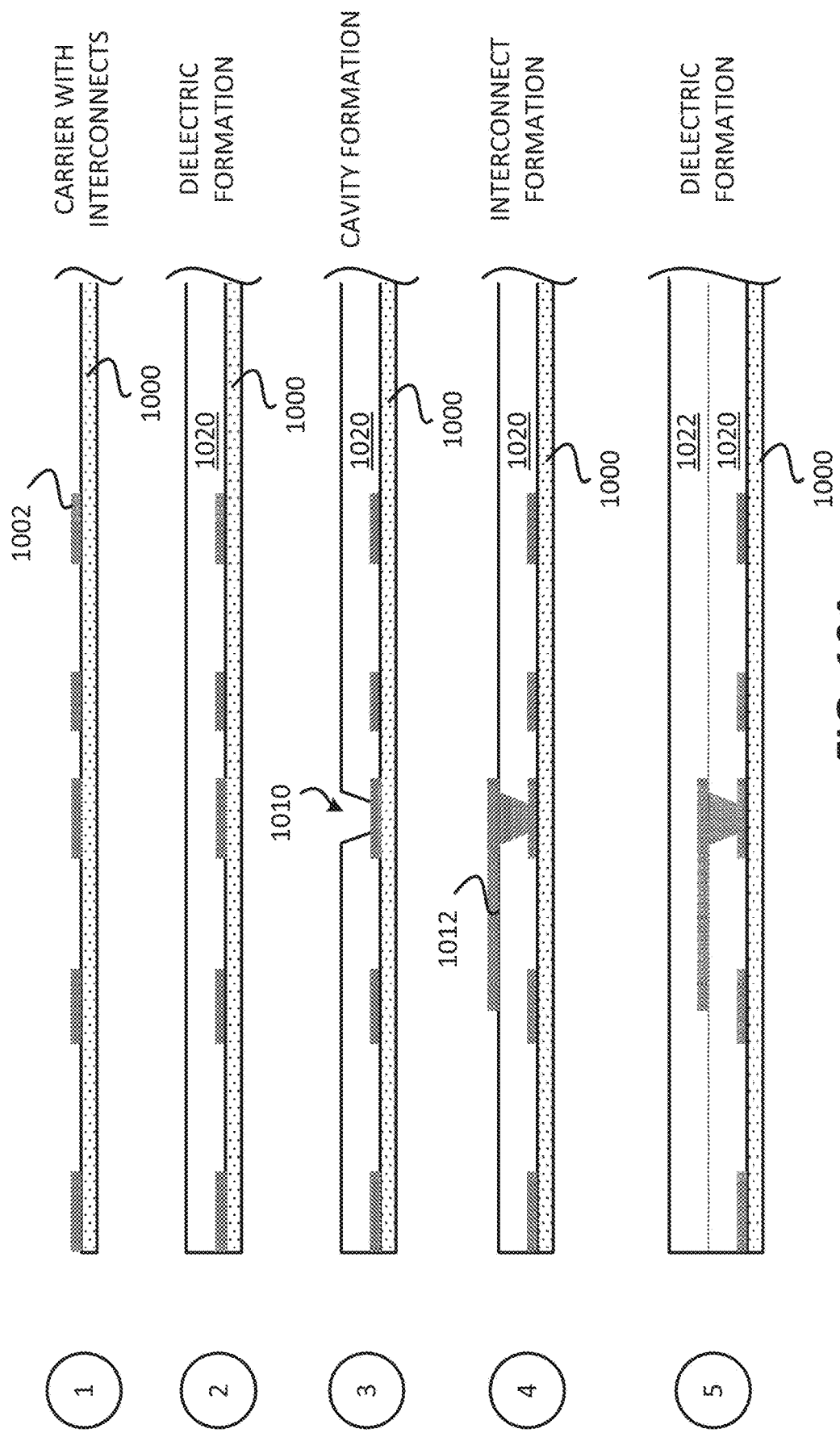
FIGS. 10A-10C illustrate an exemplary sequence for fabricating a substrate.
Figure 10B:
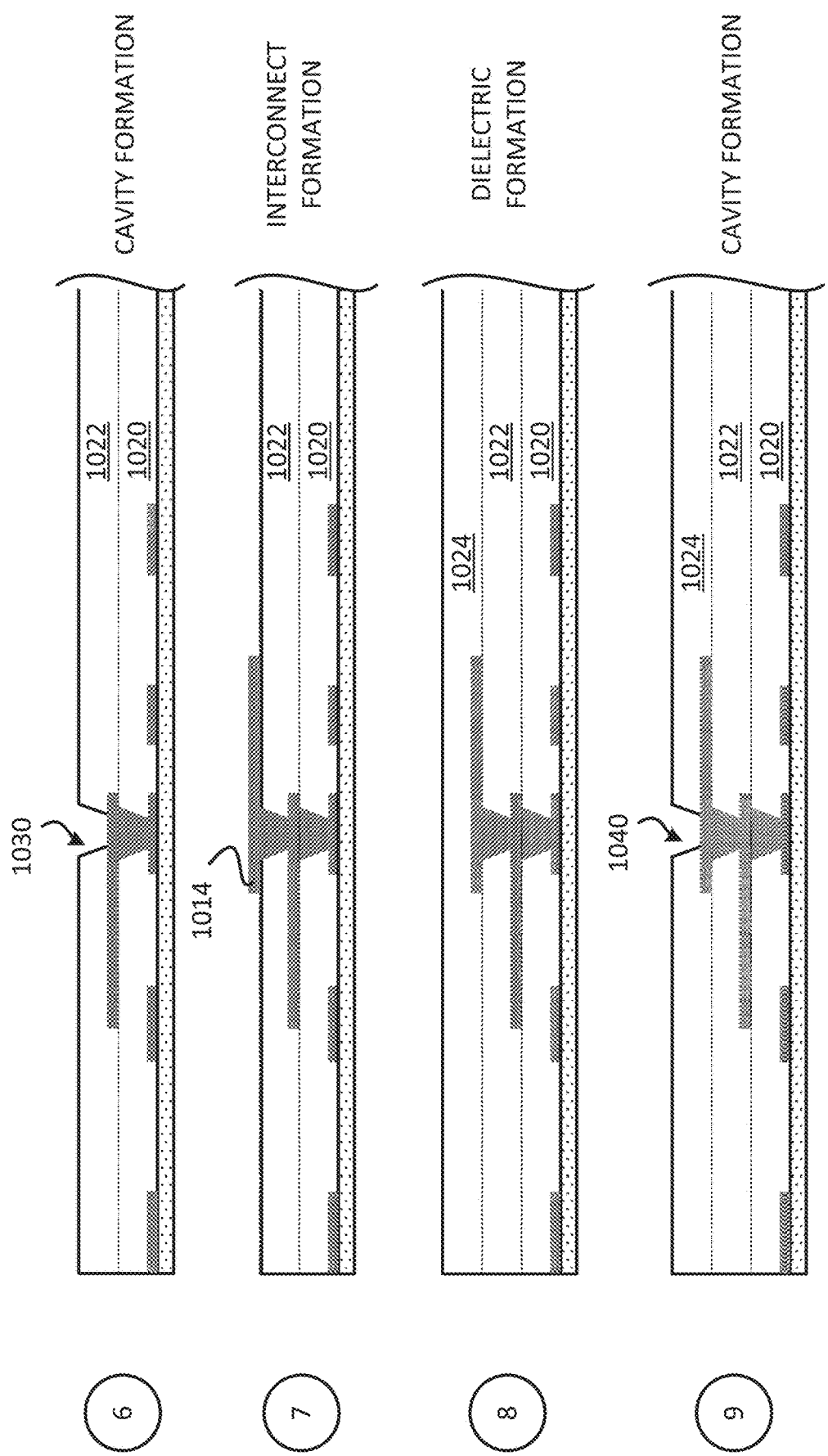
Figure 10C:
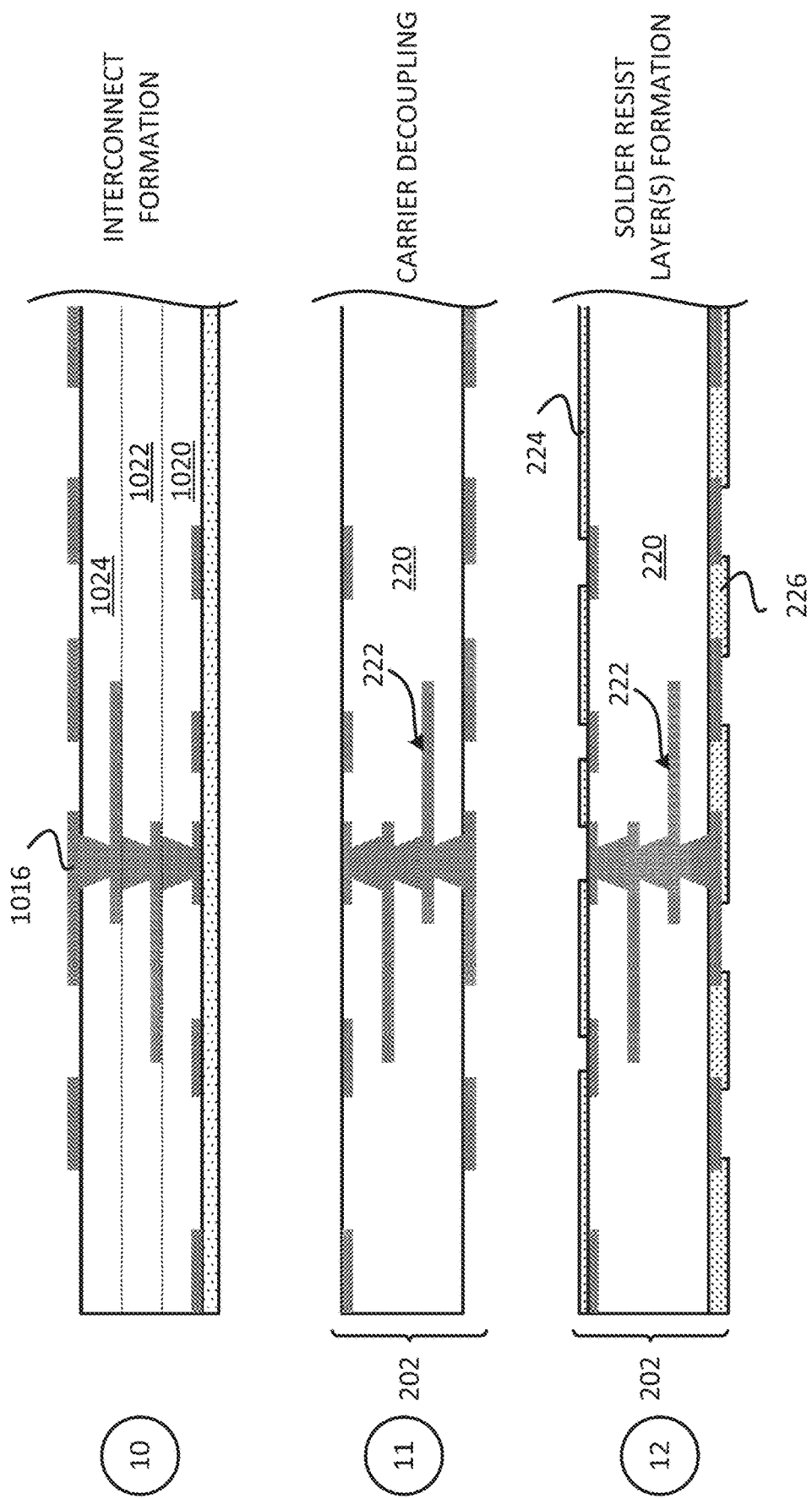

In some implementations, fabricating a substrate includes several processes. FIGS. 10A-10C illustrate an exemplary sequence for providing or fabricating a substrate. In some implementations, the sequence of FIGS. 10A-10C may be used to provide or fabricate the substrate 202 of FIG. 2. However, the process of FIGS. 10A-10C may be used to fabricate any of the substrates described in the disclosure.

It should be noted that the sequence of FIGS. 10A-10C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 10A, illustrates a state after a carrier 1000 is provided and a metal layer is formed over the carrier 1000. The metal layer may be patterned to form interconnects 1002. A plating process and etching process may be used to form the metal layer and interconnects.

Stage 2 illustrates a state after a dielectric layer 1020 is formed over the carrier 1000 and the interconnects 1002. The dielectric layer 1020 may include polyimide. However, different implementations may use different materials for the dielectric layer.

Stage 3 illustrates a state after a plurality of cavities 1010 is formed in the dielectric layer 1020. The plurality of cavities 1010 may be formed using an etching process (e.g., photo etching process) or laser process.

Stage 4 illustrates a state after interconnects 1012 are formed in and over the dielectric layer 1020. For example, a via, pad and/or traces may be formed. A plating process may be used to form the interconnects.

Stage 5 illustrates a state after another dielectric layer 1022 is formed over the dielectric layer 1020. The dielectric layer 1022 may be the same material as the dielectric layer 1020. However, different implementations may use different materials for the dielectric layer.

Stage 6, as shown in FIG. 10B, illustrates a state after a plurality of cavities 1030 is formed in the dielectric layer 1022. An etching process or laser process may be used to form the cavities 1030.

Stage 7 illustrates a state after interconnects 1014 are formed in and over the dielectric layer 1022. For example, via, pad and/or trace may be formed. A plating process may be used to form the interconnects.

Stage 8 illustrates a state after another dielectric layer 1024 is formed over the dielectric layer 1022. The dielectric layer 1024 may be the same material as the dielectric layer 1020. However, different implementations may use different materials for the dielectric layer.

Stage 9 illustrates a state after a plurality of cavities 1040 is formed in the dielectric layer 1024. An etching process or laser process may be used to form the cavities 1040.

Stage 10, as shown in FIG. 10C, illustrates a state after interconnects 1016 are formed in and over the dielectric layer 1024. For example, via, pad and/or trace may be formed. A plating process may be used to form the interconnects.

Some or all of the interconnects 1002, 1012, 1014 and/or 1016 may define the plurality of interconnects 222 of the substrate 202. The dielectric layers 1020, 1022, 1024 may be represented by the at least one dielectric layer 220.

Stage 11 illustrates a state after the carrier 1000 is decoupled (e.g., removed, grinded out) from the dielectric layer 220, leaving the substrate 202.

Stage 12 illustrates a state after the first solder resist layer 224 and the second solder resist layer 226 are formed over the substrate 202.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 11:
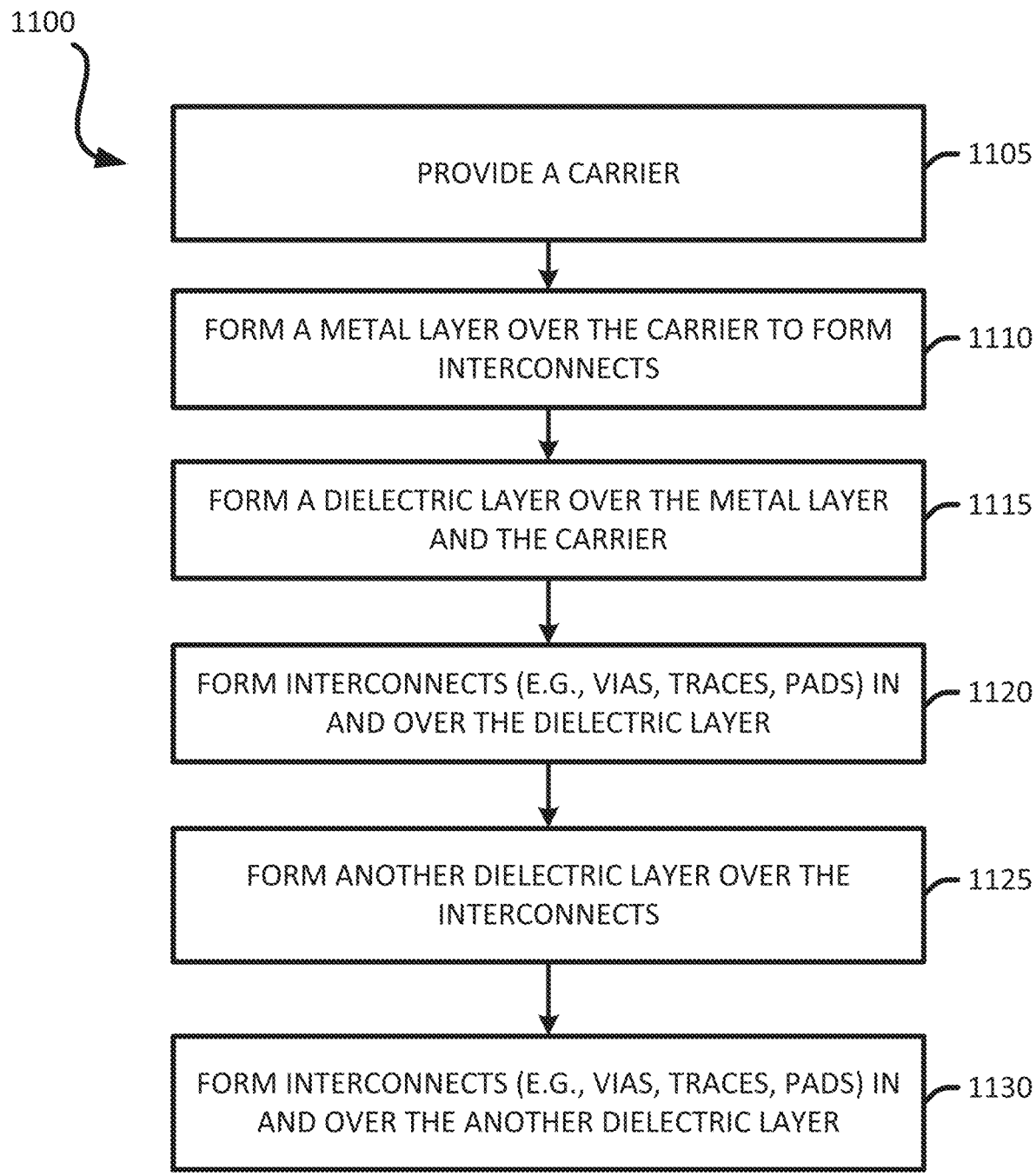
FIG. 11 illustrates an exemplary flow diagram of a method for fabricating a substrate.

In some implementations, fabricating a substrate includes several processes. FIG. 11 illustrates an exemplary flow diagram of a method 1100 for providing or fabricating a substrate. In some implementations, the method 1100 of FIG. 11 may be used to provide or fabricate the substrate of FIG. 2. For example, the method of FIG. 11 may be used to fabricate the substrate 202.

It should be noted that the method of FIG. 11 may combine one or more processes in order to simplify and/or clarify the method for providing or fabricating a substrate. In some implementations, the order of the processes may be changed or modified.

The method provides (at 1105) a carrier 1000. Different implementations may use different materials for the carrier. The carrier may include a substrate, glass, quartz and/or carrier tape. Stage 1 of FIG. 10A illustrates a state after a carrier is provided.

The method forms (at 1110) a metal layer over the carrier 1000. The metal layer may be patterned to form interconnects. A plating process may be used to form the metal layer and interconnects. Stage 1 of FIG. 10A illustrates a state after a metal layer and interconnects 1002 are formed.

The method forms (at 1115) a dielectric layer 1020 over the carrier 1000 and the interconnects 1002. The dielectric layer 1020 may include polyimide. Forming the dielectric layer may also include forming a plurality of cavities (e.g., 1010) in the dielectric layer 1020. The plurality of cavities may be formed using an etching process (e.g., photo etching) or laser process. Stages 2-3 of FIG. 10A illustrate forming a dielectric layer and cavities in the dielectric layer.

The method forms (at 1120) interconnects in and over the dielectric layer. For example, the interconnects 1012 may be formed in and over the dielectric layer 1020. A plating process may be used to form the interconnects. Forming interconnects may include providing a patterned metal layer over and/or in the dielectric layer. Stage 4 of FIG. 10A illustrates an example of forming interconnects in and over a dielectric layer.

The method forms (at 1125) a dielectric layer 1022 over the dielectric layer 1020 and the interconnects. The dielectric layer 1022 may include polyimide. Forming the dielectric layer may also include forming a plurality of cavities (e.g., 1030) in the dielectric layer 1022. The plurality of cavities may be formed using an etching process or laser process. Stages 5-6 of FIGS. 10A-10B illustrate forming a dielectric layer and cavities in the dielectric layer.

The method forms (at 1130) interconnects in and/or over the dielectric layer. For example, the interconnects 1014 may be formed. A plating process may be used to form the interinterconnects. Forming interconnects may include providing a patterned metal layer over an in the dielectric layer. Stage 7 of FIG. 10B illustrates an example of forming interconnects in and over a dielectric layer.

The method may form additional dielectric layer(s) and additional interconnects as described at 1125 and 1130. Stages 8-10 of FIG. 10B-10C illustrate an example of forming interconnects in and over a dielectric layer.

Once all the dielectric layer(s) and additional interconnects are formed, the method may decouple (e.g., remove, grind out) the carrier (e.g., 1000) from the dielectric layer 1020, leaving the substrate. In some implementations, the method may form solder resist layers (e.g., 224, 226) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 12A:
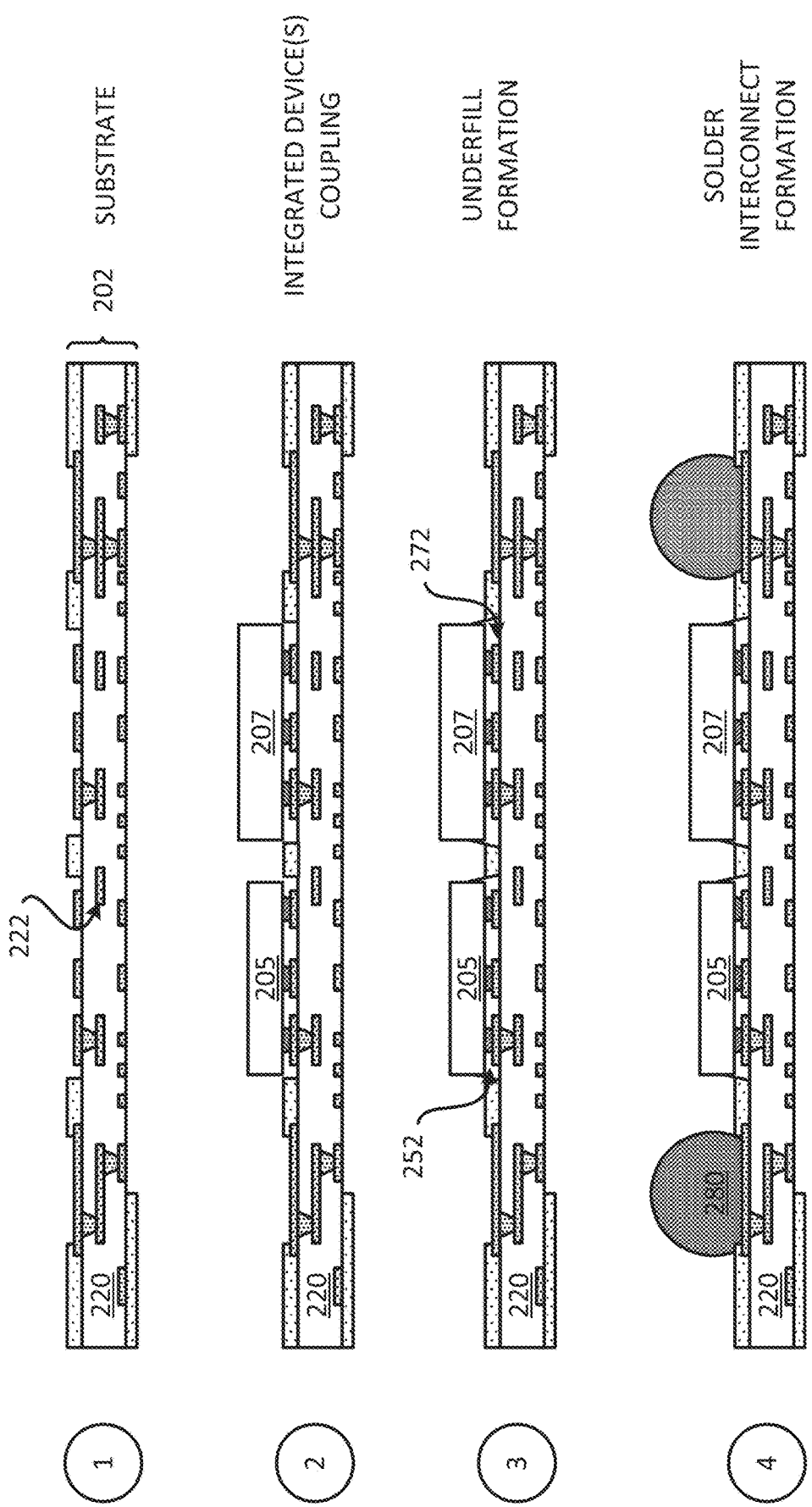
FIGS. 12A-12B illustrate an exemplary sequence for fabricating a package that includes a high-density interconnect integrated device coupled to a substrate.
Figure 12B:
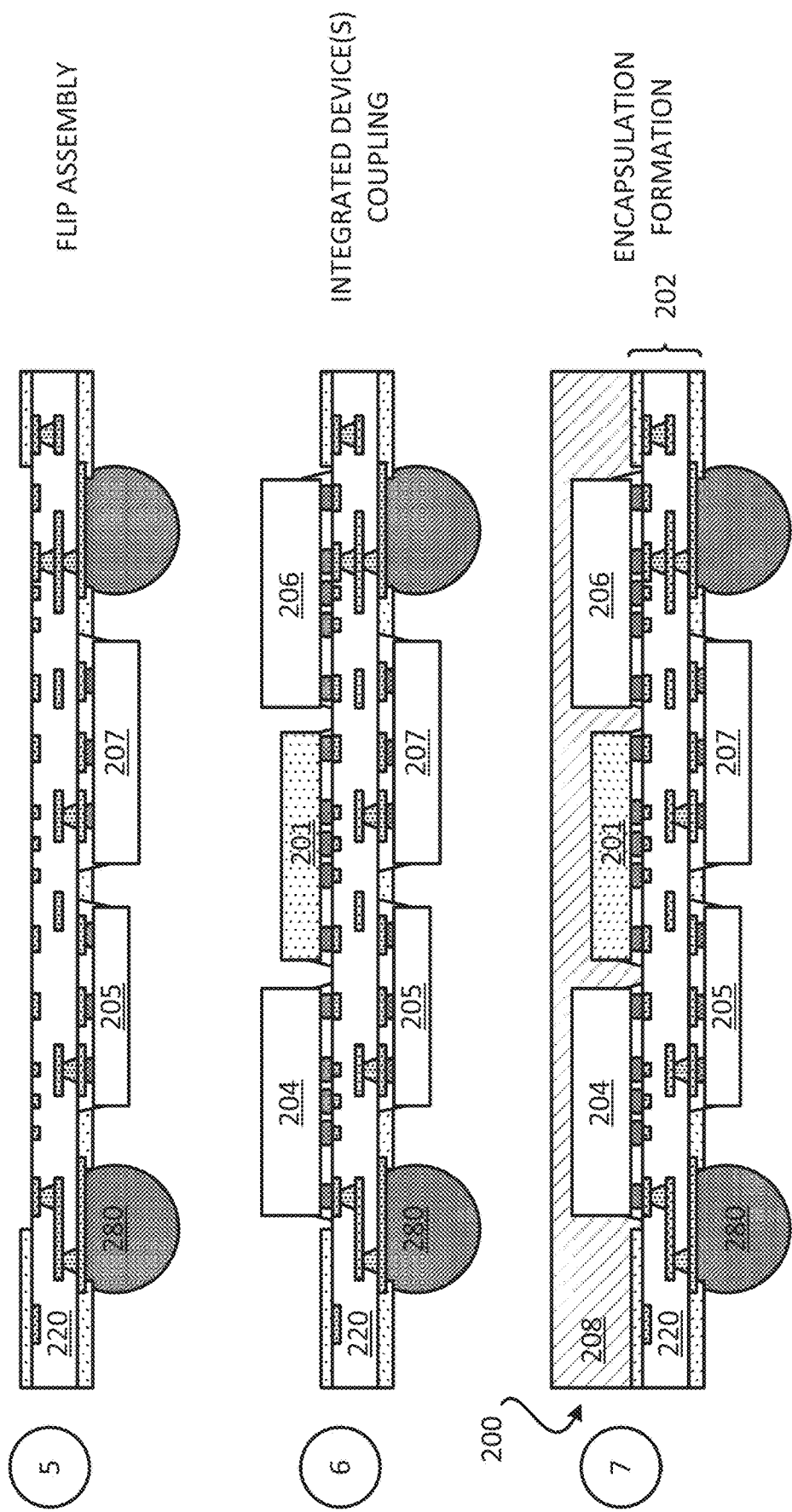

Exemplary Sequence for Fabricating a Package That Includes a High-Density Interconnect Integrated Device Coupled to a Substrate FIGS. 12A-12B illustrate an exemplary sequence for providing or fabricating a package that includes a high-density interconnect integrated device coupled to a substrate. In some implementations, the sequence of FIGS. 12A-12B may be used to provide or fabricate the package 200 that includes the substrate 202 and the interconnect integrated device 201 of FIG. 2, or any of the packages described in the disclosure.

It should be noted that the sequence of FIGS. 12A-12B may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 12A-12B may be used to fabricate one package or several packages at a time (as part of a wafer).

Stage 1, as shown in FIG. 12A, illustrates a state after the substrate 202 is provided. The substrate 202 may be provided by a supplier or fabricated. A process similar to the process shown in FIGS. 10A-10C may be used to fabricate the substrate 202. However, different implementations may use different processes to fabricate the substrate 202. Examples of processes that may be used to fabricate the substrate 202 include a semi-additive process (SAP) and a modified semi-additive process (mSAP). The substrate 202 includes at least one dielectric layer 220, and a plurality of interconnects 222. The substrate 202 may be a laminate substrate, a coreless substrate, an organic substrate, a substrate that includes a core layer. In some implementations, the at least one dielectric layer 220 may include a core layer and/or prepreg layers.

Stage 2 illustrates a state after the integrated device 205 and the integrated device 207 are coupled to a second surface (e.g., bottom surface) of the substrate 202. The integrated device 205 is coupled to the substrate 202 through the plurality of interconnects 250. The plurality of interconnects 250 may be coupled to interconnects from the plurality of interconnects 222 of the substrate 202. The integrated device 205 may be coupled to the substrate 202 such that the front side (e.g., active side) of the integrated device 205 is facing the substrate 202. The integrated device 207 is coupled to the substrate 202 through the plurality of interconnects 270. The plurality of interconnects 270 may be coupled to interconnects from the plurality of interconnects 222 of the substrate 202. The integrated device 207 may be coupled to the substrate 202 such that the front side (e.g., active side) of the integrated device 207 is facing the substrate 202.

Stage 3 illustrates a state after an underfill 252 is provided between the substrate 202 and the integrated device 205, and an underfill 272 is provided between the substrate 202 and the integrated device 207. An underfill may be disposed between the substrate 202 and a respective integrated device.

Stage 4 illustrates a state after the plurality of solder interconnects 280 is coupled to the second surface of the substrate 202. The plurality of solder interconnects 280 may be coupled to interconnects from the plurality of interconnects 222 of the substrate 202. A reflow process may be used to couple the plurality of solder interconnects 280 to the substrate 202.

Stage 5, as shown in FIG. 12B, illustrates a state after the substrate 202 with the integrated device 205, the integrated device 207, and the plurality of solder interconnects 280, are flipped.

Stage 6 illustrates a state after the first integrated device 204, the second integrated device 206 and the interconnect integrated device 201 are coupled to a first surface (e.g., top surface) of the substrate 202. The first integrated device 204 may be coupled to the substrate 202 through a plurality of interconnects 240. The second integrated device 206 may be coupled to the substrate 202 through a plurality of interconnects 260. The interconnect integrated device 201 may be coupled to the substrate 202 through a plurality of solder interconnects 210.

Stage 6 may also illustrate a state after underfill is formed between an integrated device and the substrate 202. For example, an underfill 243 may be disposed between the first integrated device 204 and the substrate 202, an underfill 263 may be disposed between the second integrated device 206 and the substrate 202, and an underfill 213 may be disposed between the interconnect integrated device 201 and the substrate 202.

Stage 7 illustrates a state after the encapsulation layer 208 is formed over the first surface of the substrate 202 such that the encapsulation layer 208 encapsulates the first integrated device 204, the second integrated device 206 and the interconnect integrated device 201. The process of forming and/or disposing the encapsulation layer 208 may include using a compression and transfer molding process, a sheet molding process, or a liquid molding process. Stage 8 may illustrate the package 200 that includes the substrate 202, the first integrated device 204, the second integrated device 206, the interconnect integrated device 201, the integrated device 205, the integrated device 207, and the encapsulation layer 208, as described in at least FIG. 2.

The packages (e.g., 200, 700) described in the disclosure may be fabricated one at a time or may be fabricated together as part of one or more wafers and then singulated into individual packages.

Figure 13:
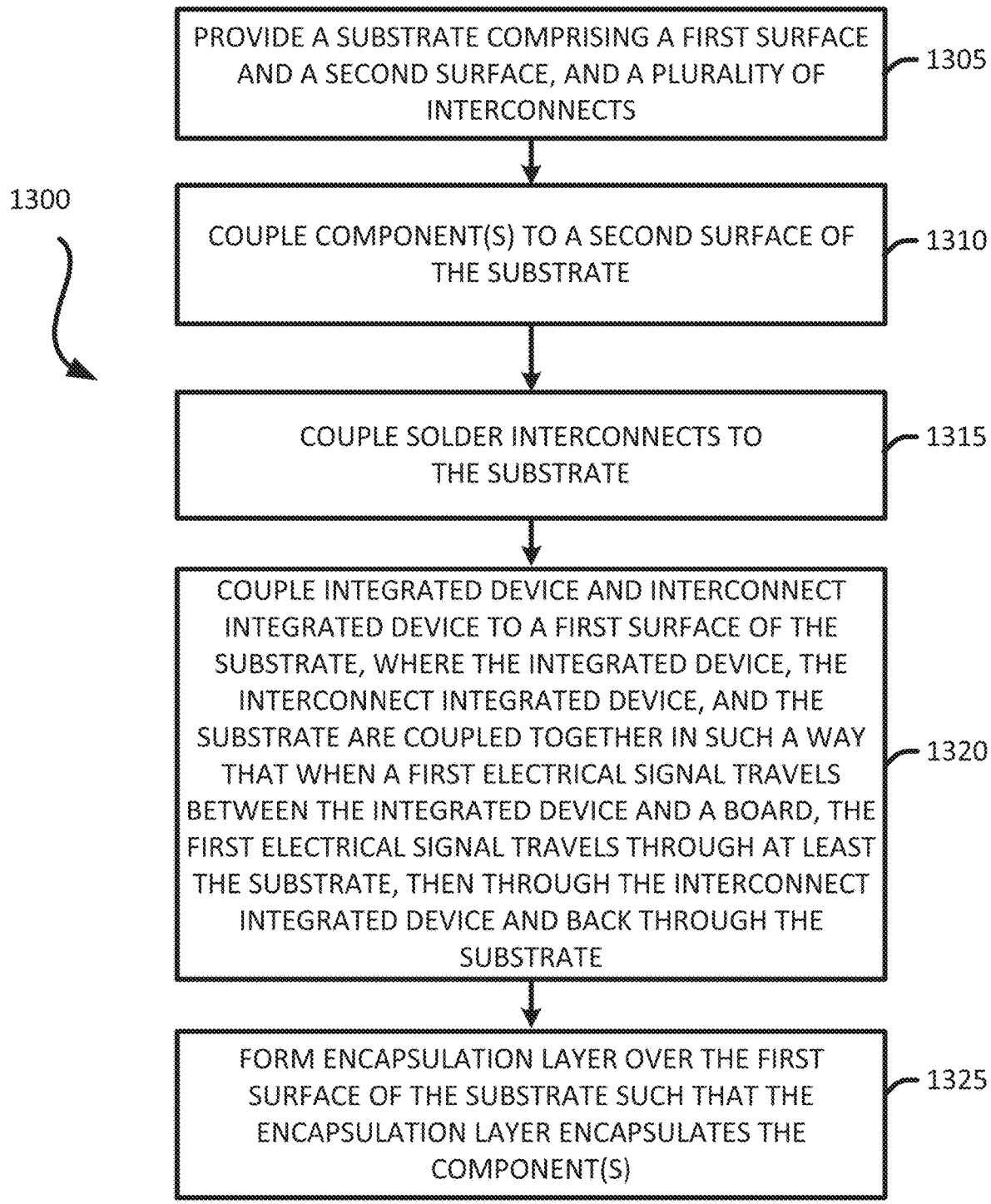
FIG. 13 illustrates an exemplary flow diagram of a method for fabricating a package that includes a high-density interconnect integrated device coupled to a substrate.

Exemplary Flow Diagram of a Method for Fabricating a Package that Includes a High-Density Interconnect Integrated Device Coupled to a Substrate In some implementations, fabricating a package that includes a high-density interconnect integrated device coupled to a substrate includes several processes. FIG. 13 illustrates an exemplary flow diagram of a method 1300 for providing or fabricating a package that includes a high-density interconnect integrated device coupled to a substrate. In some implementations, the method 1300 of FIG. 13 may be used to provide or fabricate the package 200 of FIG. 2 described in the disclosure. However, the method 1300 may be used to provide or fabricate any of the packages described in the disclosure.

It should be noted that the method of FIG. 13 may combine one or more processes in order to simplify and/or clarify the method for providing or fabricating a package that includes a high-density interconnect integrated device coupled to a substrate. In some implementations, the order of the processes may be changed or modified.

The method provides (at 1305) a substrate (e.g., 202). The substrate 202 may be provided by a supplier or fabricated. The substrate 202 includes a first surface and a second surface. The substrate 202 includes at least one dielectric layer 220 and a plurality of interconnects 222. Different implementations may provide different substrates. A process similar to the process shown in FIGS. 10A-10C may be used to fabricate the substrate 202. However, different implementations may use different processes to fabricate the substrate 202. Stage 1 of FIG. 12A illustrates and describes an example of providing a substrate.

The method couples (at 1310) components to a second surface of the substrate 202. Different implementations may couple different components and/or different number of components. Components may include the integrated device 205, the integrated device 207, and/or passive devices (e.g., discrete capacitors). Coupling the components may include providing underfill between the integrated device and the substrate. Stages 2-3 of FIG. 12B, illustrates and describes examples of various components being coupled to the second surface of the substrate.

The method couples (at 1315) a plurality of solder interconnects (e.g., 280) to the second surface of the substrate (e.g., 202). Stage 4 of FIG. 12A, illustrates and describes an example of coupling solder interconnects to the substrate.

The method couples (at 1320) at least one integrated device (e.g., 204, 206) and an interconnect integrated device (e.g., 201) to the first surface of the substrate (e.g., 202). The first integrated device 204 may be coupled to the substrate 202 through the plurality of interconnects 240. The plurality of interconnects 240 may be coupled to interconnects from the plurality of interconnects 222 of the substrate 202. The first integrated device 204 may be coupled to the substrate 202 such that the front side (e.g., active side) of the first integrated device 204 is facing the substrate 202. As an example, the first integrated device 204 and the interconnect integrated device 201 may be coupled to the substrate 202 so that the integrated device, the interconnect integrated device, and the substrate are coupled together in such a way that when a first electrical signal travels between the integrated device and a board (e.g., 290), the first electrical signal travels through the substrate 202, then through the interconnect integrated device 201 and back through the substrate 202. The substrate 202 may be flipped before integrated devices are coupled to the substrate 202.

The second integrated device 206 may be coupled to the substrate 202 through the plurality of interconnects 260. The plurality of interconnects 640 may be coupled to interconnects from the plurality of interconnects 222 of the substrate 202. The second integrated device 206 may be coupled to the substrate 202 such that the front side (e.g., active side) of the second integrated device 206 is facing the substrate 202.

As an example, the first integrated device 204, the second integrated device 206, and the interconnect integrated device 201 may be coupled to the substrate 202 so that the integrated device, the interconnect integrated device, and the substrate are coupled together in such a way that when a first electrical signal travels between the first integrated device 204 and the second integrated device 206, travel through the interconnect integrated device 201. For example, a first electrical signal between the first integrated device 204 and the second integrated device 206, may travel through the substrate 202, then through the interconnect integrated device 201 and back through the substrate 202. Stage 6 of FIG. 12B illustrates and describes an example of integrated devices and an interconnect integrated device being coupled to a substrate. Coupling the integrated device to the substrate may also include providing an underfill (e.g., 213, 243, 263) between a respective integrated device (e.g., 204, 206) and the substrate 202. Stage 6 of FIG. 12B illustrates and describes an example of an underfill being provided.

The method forms (at 1325) an encapsulation layer (e.g., 208) over the second surface of the substrate (e.g., 202) such that the encapsulation layer 208 encapsulates the first integrated device 204, the second integrated device 206 and the interconnect integrated device 201. The process of forming and/or disposing the encapsulation layer 208 may include using a compression and transfer molding process, a sheet molding process, or a liquid molding process. Stage 7 of FIG. 12B illustrates and describes an example of an encapsulation layer that is located over the substrate and encapsulates the integrated devices.

Exemplary Electronic Devices

Figure 14:
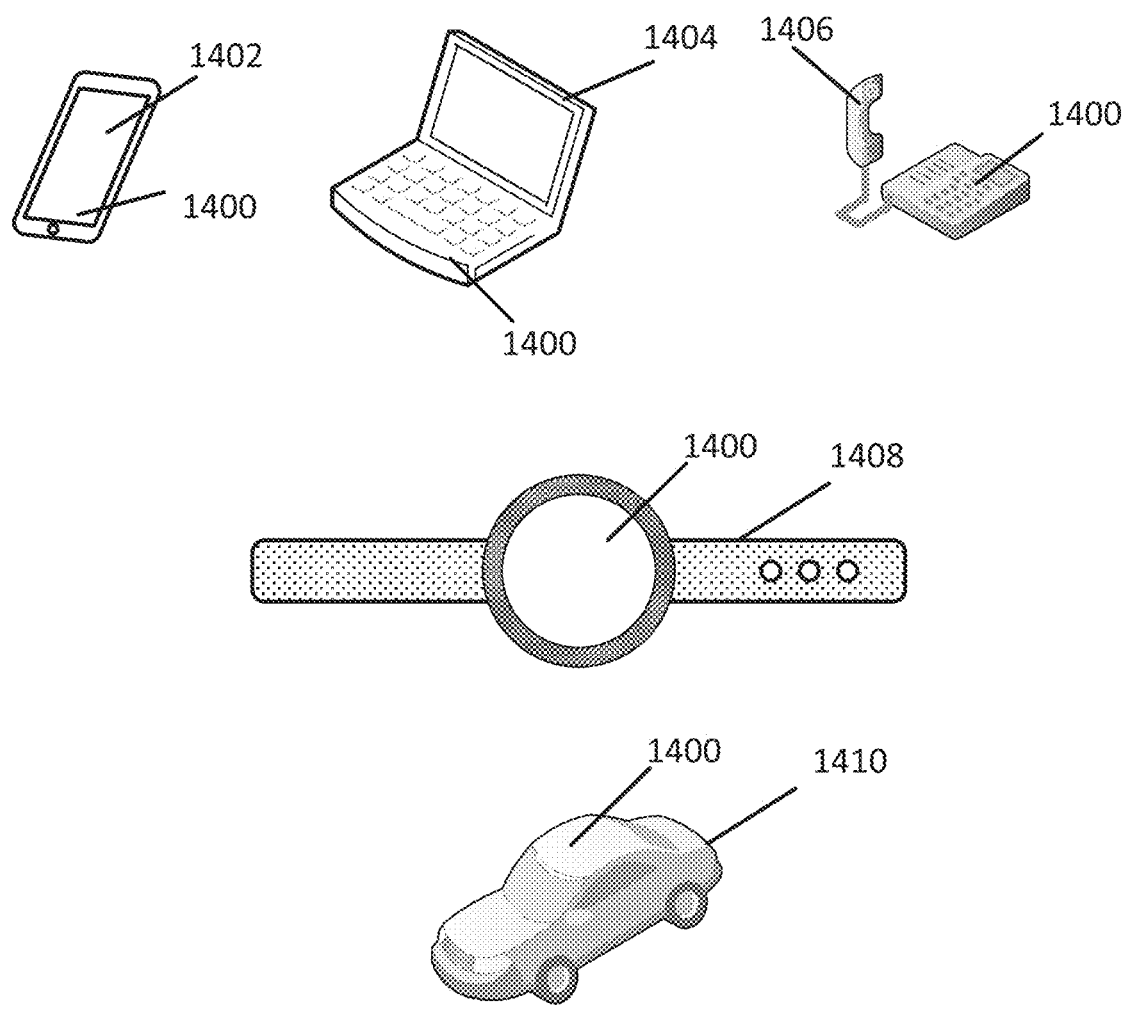
FIG. 14 illustrates various electronic devices that may integrate a die, an electronic circuit, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-7, 8A-8D, 9, 10A-10C, 11, 12A-12B, and/or 13-14 may be rearranged and/or combined into a single component, process, feature or function or embodied in several components, processes, or functions. Additional elements, components, processes, and/or functions may also be added without departing from the disclosure. It should also be noted FIGS. 2-7, 8A-8D, 9, 10A-10C, 11, 12A-12B, and/or 13-14 and its corresponding description in the present disclosure is not limited to dies and/or ICs. In some implementations, FIGS. 2-7, 8A-8D, 9, 10A-10C, 11, 12A-12B, and/or 13-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

In a first further example, a package is described, the package comprising a substrate comprising a plurality of interconnects, an integrated device coupled to the substrate, and an interconnect integrated device coupled to a surface of the substrate, wherein the integrated device, the interconnect integrated device and the substrate are configured to provide a first electrical path for a first electrical signal of the integrated device, that extends (e.g., travels) through at least the substrate, then through the interconnect integrated device and back through the substrate. Further, the plurality of interconnects of the substrate may comprise a first minimum pitch, and the interconnect integrated device may comprise a plurality of interconnects having a second minimum pitch that is less than the first minimum pitch. Also, the interconnect integrated device may comprise a die substrate, at least one dielectric layer and a plurality of interconnects. Further, the die substrate may include silicon, glass and/or quartz. Also, the interconnect integrated device may include a die that is free of a transistor. Further, the package may comprise a second integrated device coupled to the surface of the substrate, wherein the interconnect integrated device may be located between the integrated device and the second integrated device. Also, the integrated device, the interconnect integrated device, the second integrated device and the substrate may be configured to provide the first electrical path for the first electrical signal between the integrated device and the second integrated device, that extends through at least the substrate, then through the interconnect integrated device and back through the substrate, and the interconnect integrated device may be configured as a bridge between the integrated device and the second integrated device, for at least the first electrical signal. Also, the integrated device and the interconnect integrated device may be coupled to a first surface of the substrate. Further, the integrated device and the interconnect integrated device may be coupled to a second surface of the substrate. Also, the interconnect integrated device may comprise a second substrate having a plurality of interconnects. Further, the integrated device, the interconnect integrated device and the substrate may be configured to provide the first electrical path for the first electrical signal of the integrated device, that (i) extends (e.g., enters) through a front side of the interconnect integrated device, (ii) extends (e.g., travels) through at least one interconnect in the interconnect integrated device, and (iii) extends (e.g., exits) through the front side of the interconnect integrated device. The entering, traveling and/or exiting may be applicable to the electrical path and/or the electrical signal.

In another further example, an apparatus is described, the apparatus comprising a substrate comprising a plurality of interconnects, an integrated device coupled to the substrate, and means for integrated device interconnection coupled to a surface of the substrate, wherein the integrated device, the means for integrated device interconnection and the substrate are configured to provide a first electrical path for a first electrical signal of the integrated device, that extends (e.g., travels) through at least the substrate, then through the means for integrated device interconnection and back through the substrate. Further, the plurality of interconnects of the substrate may comprise a first minimum pitch, and the means for integrated device interconnection may comprise a plurality of interconnects having a second minimum pitch that is less than the first minimum pitch. Also, the means for integrated device interconnection may comprise a die substrate, at least one dielectric layer and a plurality of interconnects. Further, the die substrate may include silicon, glass and/or quartz. Also, the means for integrated device interconnection may include a die that is free of a transistor. Further, the apparatus may comprise a second integrated device coupled to the surface of the substrate, wherein the means for integrated device interconnection is located between the integrated device and the second integrated device. Also, the integrated device, the means for integrated device interconnection, the second integrated device and the substrate may be configured to provide the first electrical path for the first electrical signal between the integrated device and the second integrated device, that travels through at least the substrate, then through the means for integrated device interconnection and back through the substrate, and the means for integrated device interconnection may be configured as a bridge between the integrated device and the second integrated device, for at least the first electrical signal. Further, the integrated device and the means for integrated device interconnection may be coupled to a first surface of the substrate or a second surface of the substrate. Further, the interconnect integrated device may comprise a second substrate having a plurality of interconnects. Also, the integrated device, the means for integrated device interconnection and the substrate may be configured to provide the first electrical path for the first electrical signal that (i) extends (e.g., enters) through a front side of the means for integrated device interconnection, (ii) extends (e.g., travels) through at least one interconnect in the means for integrated device interconnection, and (iii) extends (e.g., exits) through the front side of the means for integrated device interconnection. The entering, traveling and/or exiting may be applicable to the electrical path and/or the electrical signal.

In another further example, a method for fabricating a package is described, the method comprising providing a substrate comprising a plurality of interconnects, coupling an integrated device to the substrate, and coupling an interconnect integrated device to a surface of the substrate, wherein the integrated device, the interconnect integrated device, and the substrate are configured to provide a first electrical path for a first electrical path for a first electrical signal of the integrated device, that extends (e.g., travels) through at least the substrate, then through the interconnect integrated device and back through the substrate. Further, the plurality of interconnects of the substrate may comprise a first minimum pitch, and wherein the interconnect integrated device may comprise a plurality of interconnects having a second minimum pitch that is less than the first minimum pitch. Also, the interconnect integrated device may comprise a die substrate, at least one dielectric layer and a plurality of interconnects. Further, the integrated device, the interconnect integrated device, and the substrate may be configured to provide the first electrical path for the first electrical signal of the integrated device, that (i) extends (e.g., enters) through a front side of the interconnect integrated device, (ii) extends (e.g., travels) through at least one interconnect in the interconnect integrated device, and (iii) extends (e.g., exits) through the front side of the interconnect integrated device. The entering, traveling and/or exiting may be applicable to the electrical path and/or the electrical signal.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
    a substrate comprising a plurality of interconnects;
    an integrated device coupled to the substrate;
    a second integrated device coupled to the substrate; and
    an interconnect integrated device coupled to a surface of the substrate,
    wherein the interconnect integrated device and the substrate are configured to provide an electrical path for an electrical signal between the integrated device and the second integrated device, such that the electrical path extends through at least the substrate, and through the interconnect integrated device and back through the substrate.

2. The package of claim 1,
    wherein the plurality of interconnects of the substrate comprises a first minimum pitch, and
    wherein the interconnect integrated device comprises a plurality of interconnects having a second minimum pitch that is less than the first minimum pitch.

3. The package of claim 1, wherein the interconnect integrated device comprises a die substrate, at least one dielectric layer and a plurality of interconnects.

4. The package of claim 3, wherein the die substrate includes silicon, glass and/or quartz.

5. The package of claim 1, wherein the interconnect integrated device includes a die that is free of a transistor.

6. The package of claim 1, further comprising a third integrated device coupled to the surface of the substrate,
wherein the interconnect integrated device is located between the integrated device and the third integrated device, and
wherein the interconnect integrated device and the substrate are further configured to provide another electrical path for another electrical signal between the integrated device and the third integrated device, such that the another electrical path extends through at least the substrate, then through the interconnect integrated device and back through the substrate.

7. The package of claim 1,
wherein the interconnect integrated device and the substrate are further configured to provide a second electrical path for a second electrical signal between the integrated device and the second integrated device, such that the second electrical path extends through at least the substrate, then through the interconnect integrated device and back through the substrate, and
wherein the interconnect integrated device is configured as a bridge between the integrated device and the second integrated device, for at least the electrical signal and the second electrical signal.

8. The package of claim 1, wherein the integrated device and the interconnect integrated device are coupled to a first surface of the substrate.

9. The package of claim 1,
wherein the substrate includes a first surface and a second surface, and
wherein the integrated device and the interconnect integrated device are coupled to the second surface of the substrate.

10. The package of claim 1, wherein the interconnect integrated device and the substrate are configured to provide the electrical path for the electrical signal between the integrated device and second integrated device, such that the electrical path for the electrical signal (i) enters through a front side of the interconnect integrated device, (ii) travels through at least one interconnect in the interconnect integrated device, and (iii) exits through the front side of the interconnect integrated device.

11. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

12. An apparatus comprising:
a substrate comprising a plurality of interconnects;
an integrated device coupled to the substrate;
a second integrated device coupled to the substrate; and
means for integrated device interconnection coupled to a surface of the substrate,
wherein the means for integrated device interconnection and the substrate are configured to provide an electrical path for an electrical signal between the integrated device and the second integrated device, such that the electrical path extends through at least the substrate, and through the means for integrated device interconnection and back through the substrate.

13. The apparatus of claim 12,
wherein the plurality of interconnects of the substrate comprises a first minimum pitch, and
wherein the means for integrated device interconnection comprises a plurality of interconnects having a second minimum pitch that is less than the first minimum pitch.

14. The apparatus of claim 12, wherein the means for integrated device interconnection comprises a die substrate, at least one dielectric layer and a plurality of interconnects.

15. The apparatus of claim 14, wherein the die substrate includes silicon, glass and/or quartz.

16. The apparatus of claim 12, wherein the means for integrated device interconnection includes a die that is free of a transistor.

17. The apparatus of claim 12, further comprising a third integrated device coupled to the surface of the substrate,
wherein the means for integrated device interconnection is located between the integrated device and the third integrated device, and
wherein the means for integrated device connection and the substrate are further configured to provide another electrical path for another electrical signal between the integrated device and the third integrated device, such that the another electrical path extends through at least the substrate, then through the means for integrated device connection and back through the substrate.

18. The apparatus of claim 12,
wherein the means for integrated device interconnection and the substrate are further configured to provide a second electrical path for a second electrical signal between the integrated device and the second integrated device, that travels through at least the substrate, then through the means for integrated device interconnection and back through the substrate, and
wherein the means for integrated device interconnection is configured as a bridge between the integrated device and the second integrated device, for at least the electrical path for the electrical signal and the second electrical path for the second electrical signal.

19. The apparatus of claim 12, wherein the integrated device and the means for integrated device interconnection are coupled to a first surface of the substrate.

20. The apparatus of claim 12, wherein the integrated device and the means for integrated device interconnection are coupled to a second surface of the substrate.

21. The apparatus of claim 12, wherein the means for integrated device interconnection and the substrate are configured to provide the electrical path for the electrical signal between the integrated device and the second integrated device, such that the electrical path for the electrical signal (i) enters through a front side of the means for integrated device interconnection, (ii) travels through at least one interconnect in the means for integrated device interconnection, and (iii) exits through the front side of the means for integrated device interconnection.

22. The apparatus of claim 12, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

23. A method for fabricating a package, comprising:
providing a substrate comprising a plurality of interconnects;
coupling an integrated device to the substrate;
coupling a second integrated device to the substrate; and
coupling an interconnect integrated device to a surface of the substrate,
wherein the interconnect integrated device, and the substrate are configured to provide an electrical path for an electrical signal between the integrated device and the second integrated device, such that the electrical path travels through at least the substrate, and through the interconnect integrated device and back through the substrate.

24. The method of claim 23,
wherein the plurality of interconnects of the substrate comprises a first minimum pitch, and
wherein the interconnect integrated device comprises a plurality of interconnects having a second minimum pitch that is less than the first minimum pitch.

25. The method of claim 23, wherein the interconnect integrated device comprises a die substrate, at least one dielectric layer and a plurality of interconnects.

26. The method of claim 23, wherein the interconnect integrated device and the substrate are configured to provide the electrical path for the electrical signal between the integrated device and the second integrated device, such that the electrical path for the electrical signal (i) enters through a front side of the interconnect integrated device, (ii) travels through at least one interconnect in the interconnect integrated device, and (iii) exits through the front side of the interconnect integrated device.

* * * * *